(12) United States Patent
Kuboi et al.

(10) Patent No.: US 10,403,516 B2
(45) Date of Patent: Sep. 3, 2019

(54) ETCHING CHARACTERISTIC ESTIMATION METHOD, PROGRAM, INFORMATION PROCESSING APPARATUS, PROCESSING APPARATUS, DESIGNING METHOD, AND PRODUCTION METHOD

(71) Applicant: SONY SEMICONDUCTOR SOLUTIONS CORPORATION, Kanagawa (JP)

(72) Inventors: Nobuyuki Kuboi, Kanagawa (JP); Tetsuya Tatsumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 307 days.

(21) Appl. No.: 15/327,731

(22) PCT Filed: Jun. 15, 2015

(86) PCT No.: PCT/JP2015/067141
§ 371 (c)(1),
(2) Date: Jan. 20, 2017

(87) PCT Pub. No.: WO2016/017303
PCT Pub. Date: Feb. 4, 2016

(65) Prior Publication Data
US 2017/0207107 A1    Jul. 20, 2017

(30) Foreign Application Priority Data
Jul. 30, 2014 (JP) .................................. 2014-154811

(51) Int. Cl.
*H01L 21/67*    (2006.01)
*G03F 1/36*    (2012.01)
(Continued)

(52) U.S. Cl.
CPC .......... *H01L 21/67069* (2013.01); *G03F 1/36* (2013.01); *G05B 13/041* (2013.01);
(Continued)

(58) Field of Classification Search
CPC ......... H01L 21/67069; H01L 21/31116; G05B 13/041; G06F 17/5036; G06F 17/5081; G03F 1/36
(Continued)

(56) References Cited

U.S. PATENT DOCUMENTS

2008/0050926 A1*  2/2008  Nakagawa ........ H01L 21/31116
                                                                     438/710

FOREIGN PATENT DOCUMENTS

JP    2012-134271      7/2012
JP    2012-186394 A    9/2012
(Continued)

OTHER PUBLICATIONS

International Search Report prepared by the Japan Patent Office dated Aug. 21, 2015, for International Application No. PCT/JP2015/067141.

*Primary Examiner* — Sun J Lin
(74) *Attorney, Agent, or Firm* — Sheridan Ross P.C.

(57) ABSTRACT

Etching characteristics in a case where a workpiece contains a nitrogen compound and an etching gas such as a CHxFy-based gas contains hydrogen are obtained. In a flux calculation step, an information processing apparatus calculates a plurality of fluxes in a surface reaction model, a processed surface of a workpiece including a protection film layer and a reaction layer in the surface reaction model. In a protection film layer calculation step, the information processing apparatus calculates a thickness of the protection film layer by using a calculation equation for calculating a thickness of an etched protection film layer based on the basis of a removal
(Continued)

term for describing removal of the protection film layer, the removal term being selected depending on a comparison result of comparing the plurality of fluxes.

13 Claims, 17 Drawing Sheets

(51) Int. Cl.
  *G06F 17/50*  (2006.01)
  *H01L 21/311*  (2006.01)
  *G05B 13/04*  (2006.01)
(52) U.S. Cl.
  CPC ...... *G06F 17/5036* (2013.01); *G06F 17/5081* (2013.01); *H01L 21/31116* (2013.01)
(58) Field of Classification Search
  USPC .................................................. 716/100, 110
  See application file for complete search history.

(56) References Cited

FOREIGN PATENT DOCUMENTS

| | | |
|---|---|---|
| JP | 2014-029982 A | 2/2014 |
| WO | WO 2011/115023 A1 | 9/2011 |

\* cited by examiner a b

ETCHING CHARACTERISTIC ESTIMATION METHOD, PROGRAM, INFORMATION PROCESSING APPARATUS, PROCESSING APPARATUS, DESIGNING METHOD, AND PRODUCTION METHOD

CROSS REFERENCE TO RELATED APPLICATIONS

This application is a national stage application under 35 U.S.C. 371 and claims the benefit of PCT Application No. PCT/JP2015/067141 having an international filing date of 15 Jun. 2015, which designated the United States, which PCT application claimed the benefit of Japanese Patent Application No. 2014-154811 filed 30 Jul. 2014, the disclosures of which are incorporated herein by reference in their entirety.

TECHNICAL FIELD

The present technology relates to an etching characteristic estimation method, a program for causing a computer to execute the method, an information processing apparatus, a processing apparatus, a designing method, and a production method. Specifically, the present technology relates to an etching characteristic estimation method for estimating the etching characteristics of dry etching, a program for causing a computer to execute the method, an information processing apparatus, a processing apparatus, a designing method, and a production method.

BACKGROUND ART

For producing a semiconductor device, dry etching in which plasma or the like is used to perform etching has been used. The recent rapid trend of miniaturization of devices increases the importance of predicting dry etching characteristics with high precision after using simulation and understanding the etching mechanism. Among them, modeling of reaction on the processed surface significantly influences the processing shape/damage (crystal defect) simulation precision, and how to perform modeling extracting essences of actual physicochemical phenomena is important.

For example, a model in which the amount of oxygen that is secondarily reacted with a polymer layer is obtained as an outflux and etching characteristics such as an etching rate are obtained on the basis of the outflux when a CF-based gas is used to etch a workpiece including silicon dioxide ($SiO_2$) is proposed (see, for example, Patent Literature 1).

CITATION LIST

Patent Literature

Patent Literature 1: Japanese Patent Application Laid-open No. 2012-134271

DISCLOSURE OF INVENTION

Technical Problem

In etching of a workpiece including a nitrogen compound such as silicon nitride (SiN) using a CHxFy-based gas, however, the above-mentioned method generally has such a problem that it is difficult to precisely obtain the etching characteristics because effects of the nitrogen compound in a film and hydrogen contained in an etching gas are not considered.

The present technology has been conceived in view of the above circumstances, and it is an object of the present technology to obtain etching characteristics in the case where the workpiece contains a nitrogen compound and an etching gas such as a CHxFy-based gas contains hydrogen.

Solution to Problem

The present technology has been made to overcome the above-mentioned problem, and a first aspect of the present technology is an etching characteristic estimation method including: a flux calculation step including, by an information processing apparatus, calculating a plurality of fluxes in a surface reaction model, a processed surface of a workpiece including a protection film layer and a reaction layer in the surface reaction model; and a protection film layer calculation step including, by the information processing apparatus, calculating a thickness of the protection film layer by using a calculation equation for calculating a thickness of the etched protection film layer on the basis of a removal term for describing removal of the protection film layer, the removal term being selected depending on a result of comparing the plurality of fluxes, and a program for executing the method. Accordingly, such an operation that is capable of predicting etching characteristics by reflecting that the removal term can be selected depending on the results of comparing the plurality of fluxes is provided.

Further, in this first aspect, the plurality of fluxes may include an incident flux that enters the processed surface and an outflux emitted when etching the workpiece. Accordingly, such an operation that is capable of selecting the removal term depending on the result of comparing the incident flux with the outflux is provided.

Further, in this first aspect, the plurality of fluxes may include at least fluxes of nitrogen and hydrogen. Accordingly, such an operation that is capable of selecting the removal term depending on the result of comparing the fluxes of nitrogen and hydrogen is provided.

Further, in this first aspect, the protection film layer calculation step may include, by the information processing apparatus, selecting one of at least three different terms as the removal term depending on the comparison result. Accordingly, such an operation that is capable of selecting the one of at least three different terms as the removal term is provided.

Further, in this first aspect, the protection film layer calculation step may include, by the information processing apparatus, selecting the removal term depending on a difference or ratio between the plurality of fluxes. Accordingly, such an operation that is capable of selecting the removal term depending on the difference or ratio between the plurality of fluxes is provided.

Further, in this first aspect, the etching characteristic estimation method may further include a crystal defect calculation step including, by the information processing apparatus, calculating a crystal defect on the basis of the thickness of the protection film layer. Accordingly, such an operation that is capable of calculating the crystal defect on the basis of the thickness of the protection film layer is provided.

Further, in this first aspect, the etching characteristic estimation method may further including a shape calculation step including, by the information processing apparatus, calculating a shape of the workpiece on the basis of a result of calculating the crystal defect. Accordingly, such an operation that is capable of calculating the shape of the workpiece on the basis of the result of calculating the crystal defect is provided.

Further, in this first aspect, the etching characteristic estimation method may further including a plasma state calculation step including, by the information processing apparatus, calculating a density of plasma used to etch the workpiece. Accordingly, such an operation that is capable of calculating the density of plasma is provided.

Further, a second aspect of the present technology is an information processing apparatus including: a flux calculation unit that calculates a plurality of fluxes in a surface reaction model, a processed surface of a workpiece including a protection film layer and a reaction layer is the surface reaction model; and a protection film layer calculation unit that calculates a thickness of the protection film layer by using a calculation equation for calculating a thickness of the etched protection film layer on the basis of a removal term for describing removal of the protection film layer, the removal term being selected depending on a result of comparing the plurality of fluxes. Accordingly, such an operation that is capable of predicting etching characteristics by reflecting that the removal term can be selected depending on the results of comparing the plurality of fluxes is provided.

Further, a third aspect of the present technology is a designing method including: a flux calculation step including, by an information processing apparatus, calculating a plurality of fluxes in a surface reaction model, a processed surface of a workpiece including a protection film layer and a reaction layer in the surface reaction model; a protection film layer calculation step including, by the information processing apparatus, calculating a thickness of the protection film layer by using a calculation equation for calculating a thickness of the etched protection film layer on the basis of a removal term for describing removal of the protection film layer, the removal term being selected depending on a result of comparing the plurality of fluxes; a processing shape/crystal defect calculation step including, by the information processing apparatus, calculating a change in at least one of a processing shape and a crystal defect of the workpiece on the basis of the thickness of the protection films; and a designing step including, by the information processing apparatus, performing at least one of a processing process, an OPC (Optical Proximity Correction) design, and a layout design of a semiconductor device on the basis of the calculation result in the processing shape/crystal defect calculation step. Accordingly, such an operation that is capable of performing at least one of a processing process, an OPC design, and a layout design by reflecting that the removal term can be selected depending on the results of comparing the plurality of fluxes is provided.

Further, a fourth aspect of the present technology is a processing apparatus including: a flux calculation unit that calculates a plurality of fluxes in a surface reaction model, a processed surface of a workpiece including a protection film layer and a reaction layer in the surface reaction model; a protection film layer calculation unit that calculates a thickness of the protection film layer by using a calculation equation for calculating a thickness of the etched protection film layer on the basis of a removal term for describing removal of the protection film layer, the removal term being selected depending on a result of comparing the plurality of fluxes; a processing unit that performs processing of the workpiece in accordance with processing conditions of the workpiece; a plasma state calculation unit that calculates a density of plasma used to etch the workpiece on the basis of the processing conditions; a processing shape/crystal defect calculation unit that calculates a change in at least one of a processing shape and a crystal defect of the workpiece on the basis of the calculation result of the plasma state calculation unit and the thickness of the protection film layer; and a control unit that changes the processing conditions on the basis of the calculation result of the processing shape/crystal defect calculation unit. Accordingly, such an operation that is capable of predicting etching characteristics by reflecting that the removal term can be selected depending on the results of comparing the plurality of fluxes and controlling a desired shape/amount of crystal defects is provided.

Further, a fifth aspect of the present technology is a production method including: a flux calculation unit including, by an information processing apparatus, calculating a plurality of fluxes in a surface reaction model, a processed surface of a workpiece including a protection film layer and a reaction layer in the surface reaction model; a protection film layer calculation unit including, by the information processing apparatus, calculating a thickness of the protection film layer by using a calculation equation for calculating a thickness of the etched protection film layer on the basis of a removal term for describing removal of the protection film layer, the removal term being selected depending on a result of comparing the plurality of fluxes; a processing step including, by a processing unit, performing processing of the workpiece in accordance with processing conditions of the workpiece; a plasma state calculation step including, by the information processing apparatus, calculating a density of plasma used to etch the workpiece on the basis of the processing conditions; a processing shape/crystal defect calculation step including, by the information processing apparatus, calculating a change in at least one of a processing shape and a crystal defect of the workpiece on the basis of the calculation result of the plasma state calculation unit and the thickness of the protection film layer; and a control step including, by a control unit, changing the processing conditions on the basis of the calculation result of the processing shape/crystal defect calculation step. Accordingly, such an operation that is capable of predicting etching characteristics by reflecting that the removal term can be selected depending on the results of comparing the plurality of fluxes and controlling a desired shape amount of crystal defects is provided.

Advantageous Effects of Invention

In accordance with the present technology, it is possible to exert an excellent effect of being capable of obtaining etching characteristics when a workpiece contains a nitrogen compound. It should be noted that the effect described here is not necessarily limitative and may be any effect described in the present disclosure.

MODE(S) FOR CARRYING OUT THE INVENTION

Hereinafter, embodiments for carrying out the present technology (hereinafter, referred to as embodiments) will be described. Descriptions will be made in the following order.

1. First Embodiment (Example in which a film thickness is obtained from the amount of nitrogen)
2. Second Embodiment (Example in which a film thickness is obtained from the amount of hydrogen and nitrogen)
3. Third Embodiment (Example in which a film thickness and a shape are obtained from the amount of hydrogen and nitrogen)
4. Fourth Embodiment (Example in which a film thickness is obtained from the aperture ratio and the amount of hydrogen and nitrogen)
5. Fifth Embodiment (Example in which a film thickness is obtained from the amount of nitrogen and processing is performed)

<1. First Embodiment>

[Configuration Example of Simulator]

Figure 1:
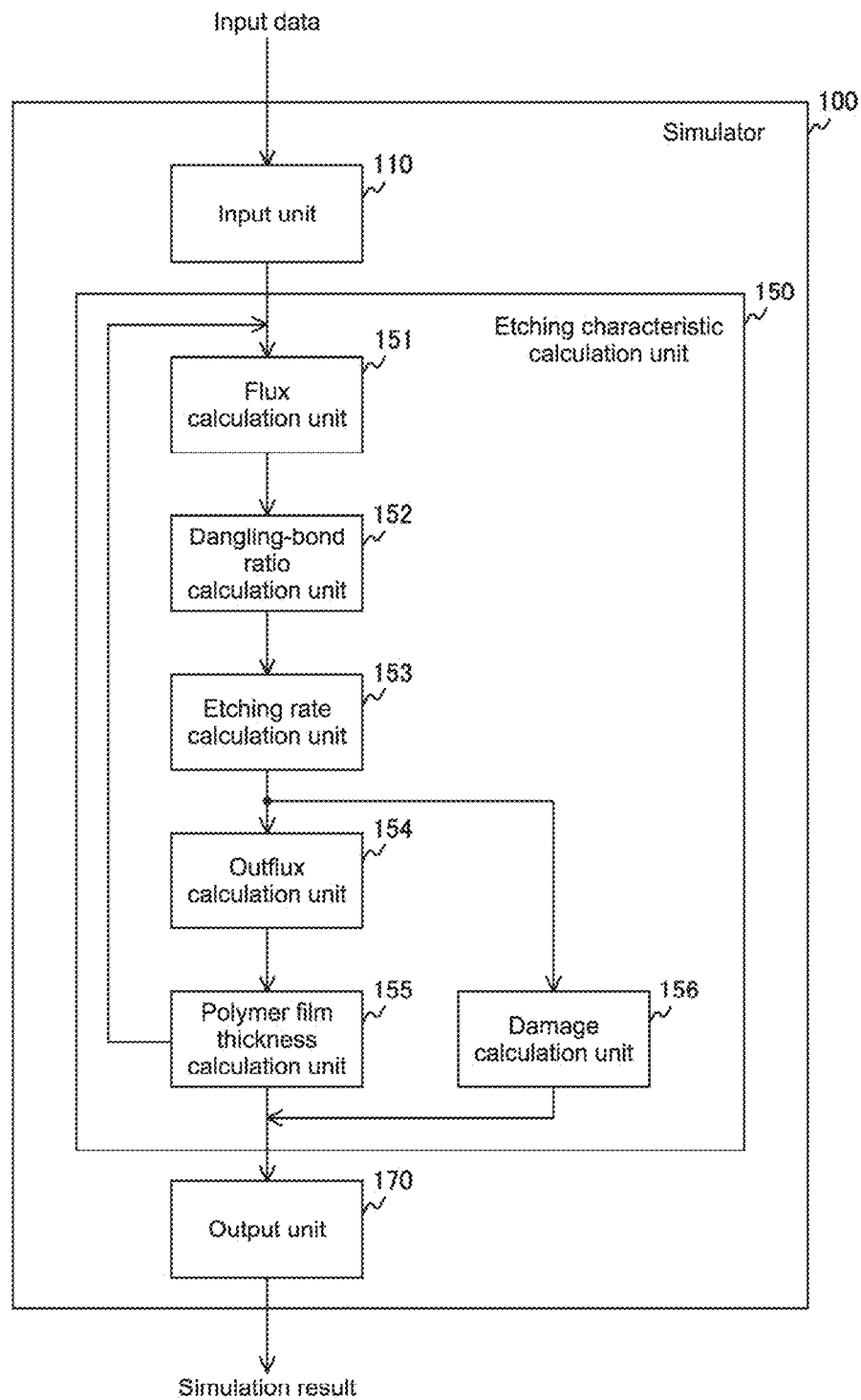
FIG. 1 A block diagram showing a configuration example of a simulator in a first embodiment.

FIG. 1 is a block diagram showing a configuration example of a simulator 100 in a first embodiment. This simulator 100 is an apparatus that estimates etching characteristics (etching rate, polymer film thickness, and damage) in dry etching, and includes an input unit 110, an etching characteristic calculation unit 150, and an output unit 170. The etching characteristic calculation unit 150 includes a flux calculation unit 151, a dangling-bond ratio calculation unit 152, an etching rate calculation unit 153, an outflux calculation unit 154, a polymer film thickness calculation unit 155, and a damage calculation unit 156. Note that the simulator 100 is an example of the information processing apparatus described in the scope of claims.

In the simulator 100, the OS (Operation System) may be any of Windows (registered trademark), Linux (registered trademark), Unix (registered trademark), and Macintosh (registered trademark). Further, the programming language may be any of C/C++ (registered trademark), Fortran, JAVA (registered trademark), and the like.

The input unit 110 inputs input data necessary for estimating etching characteristics to the etching characteristic calculation unit 150 via a GUI (Graphical User Interface) or the like. As the input data, for example, processing initial conditions such as the kind of an etching gas, the flow rate of the etching gas, the pressure of the etching gas, applied power, and etching time are input.

The flux calculation unit 151 calculates the amount of hydrogen reacted with nitrogen in a workpiece in an etching gas as necessary. Note that it does not need to calculate the flux amount of hydrogen in the case where an etching gas containing no hydrogen, such as a CF-based gas, is used.

The dangling-bond ratio calculation unit 152 calculates the dangling-bond ratio. Note that the dangling-bond ratio is a ratio of the area of a workpiece reacted with an etching gas to the area of the workpiece, and is referred to also as reaction area ratio. Further, the workpiece contains a nitrogen compound such as $Si_3N_4$, and the etching gas is, for example, a CF-based gas. The dangling-bond ratio is obtained by using, for example, the following equations.

[Math. 1]

$$\sigma_{SiN} \frac{d\theta(j,t)}{dt} = [1-\theta(j,t)]\sum_i Y_{iSiN}(V_{net})\Gamma_i - \theta(j,t)\Gamma_N^{ER} \quad \text{Equation 1}$$

In the Equation 1, $\sigma_{SiN}$ is the surface density of $Si_3N_4$, $Y_{iSiN}$ is the reaction probability of ions generated by ionization of the etching gas with $Si_3N_4$. The unit of the surface density is, for example, $cm^{-2}$. $V_{net}$ is the energy of ions at a certain depth. Further, $\theta(j,t)$ is the dangling-bond ratio of the j-th slab at a time t. The unit of t is, for example, second. Note that the slab represents respective layers in a slab model in which the workpiece is divided into a plurality of plate-like layers. $\Gamma_{DB}^{ER}$ in this Equation 1 is obtained by using the following equation.

[Math. 2]

$$\Gamma_N^{ER} = \sum_j ER(j,t-1) \times 4\rho_{SiN} \quad \text{Equation 2}$$

In the Equation 2, $\rho_{SiN}$ is the film density of $Si_3N_4$. The unit of the film density is, for example, grams per cubic centimeter ($g/cm^{-3}$). ER(j,t) is the etching rate of the j-th slab at the time t. The unit of the etching rate is, for example, centimeters per second (cm/s). Note that although the simulator 100 divides the workpiece into a plurality of slabs to calculate the dangling-bond ratio and the etching rate for each slab, the workpiece does not necessarily need to be divided into a plurality of slabs. Further, $Y_{iSiN}$ in the Equation 1 is obtained by using, for example, the following equation.

$$Y_{iSiN}(V_{net})=8.5\times0.0073\times exp\{0.0023\times(E-\Delta E)\}\times1.3 \quad \text{Equation 3}$$

In the Equation 3, E is ion energy. In the Equation 4, T is a film thickness of the polymer layer (protection film layer) generated by the primary reaction of the workplace and the etching gas. Because the polymer layer is not formed in the initial state where the time t is "0," an initial value such as "0" is set to the film thickness T. During the period when t>0, a value calculated by the polymer film thickness calculation unit 155 is set to the film thickness T. The unit of the film thickness is, for example, centimeter (cm). ΔE in this Equation 3 is obtained by using the following equation. Tp is a depth from the surface of the polymer film to the slab.

$$\Delta E = 48 + 142 \times Tp \quad \text{Equation 4}$$

The dangling-bond ratio calculation unit 152 supplies the calculated dangling-bond ratio to the etching rate calculation unit 153 and the outflux calculation unit 154.

The etching rate calculation unit 153 calculates the etching rate to obtain the estimated value thereof. In order to calculate the etching rate, the flux $\Gamma_F^*$ of fluorine reacted with $Si_3N_4$ is obtained by using the following equation.

$$\Gamma_F^* = (1 - Y_{HF})\Gamma_F \quad \text{Equation 5}$$

In the above-mentioned equation, $Y_{HF}$ is the reaction probability of hydrogen with fluorine. Further, $\Gamma_F$ is a flux of fluorine incident on the processed surface.

Further, the reaction probability $Y_{FSiN}$ of fluorine with $Si_3N_4$ is obtained by using, for example, the following equation. E is energy of ions incident on the processed surface.

$$Y_{FSiN}(V_{net}) = 0.0073 \times exp\{0.0023 \times (E - \Delta E)\} \times 1.3 \quad \text{Equation 6}$$

On the basis of $Y_{FSiN}$ and $\Gamma_F^*$ obtained by using the equations 5 and 6 and the dangling-bond ratio calculated by the dangling-bond ratio calculation unit 152, the etching rate of the j-th slab is calculated by using the following equation.

[Math. 3]

$$ER(j, t) = \frac{\theta(j, t) Y_{FSiN}(V_{net}) \Gamma_F^* / \beta_1}{3 \rho_{SiN}} \quad \text{Equation 7}$$

In the above-mentioned equation, $\beta_1$ is an index of a reaction product $CF_{\beta 1}$.

From the etching rate ER(j,t) of each slab obtained by using the Equation 7, the etching rate of the entire workpiece is calculated by using the following equation.

[Math. 4]

$$ER(t) = \sum_j ER(j, t) \quad \text{Equation 8}$$

The etching rate calculation unit 153 supplies the calculated etching rate at the previous time step t−1 to the outflux calculation unit 154 and the damage calculation unit 156 as an outflux at the time t.

The outflux calculation unit 154 calculates the amount of nitrogen reacted with carbon in the polymer layer. This nitrogen is secondarily reacted with carbon to generate $C_2N_2$, and the $C_2N_2$ volatilizes. Therefore, the amount of reacted nitrogen is regarded as an outflux that volatilizes and is output to the outside of the workpiece. The outflux is calculated on the basis of the etching rate supplied from the etching rate calculation unit 153 and the calculated dangling-bond ratio calculated by the dangling-bond ratio calculation unit 152 by using, for example, the following equation.

[Math. 5]

$$\Gamma_N^{ER} = \left[ \sum_j ER(j, t-1) \times 4 \rho_{SiN} \times \theta(j, t) - Y_{NH} \Gamma_H^{**} \right] \quad \text{Equation 9}$$

In the above-mentioned equation, $\Gamma_N^{ER}$ is the outflux emitted from the workpiece. Further, $\Gamma_H^{}$ is the amount of hydrogen in the etching gas, which is reacted with nitrogen in the workpiece. In the case where an etching gas that contains no hydrogen, such as a CF-based gas, is used, "0" is set to $\Gamma_H^{}$.

The outflux calculation unit 154 supplies the calculated outflux to the polymer film thickness calculation unit 155. Note that the outflux calculation unit 154 is an example of the flux calculation unit described in the scope of claims.

The polymer film thickness calculation unit 155 calculates the film thickness of the polymer film. In the case where an etching gas that contains no hydrogen, such as a CF-based gas, is used, the polymer film thickness T is obtained on the basis of the outflux by, using, the following equation.

[Math. 6]

$$\rho_P \frac{dT(t)}{dt} = Y_{CC}\Gamma_C - (Y_{OC1}\Gamma_O + Y_{FC}\Gamma_F + Y_{iC}\Gamma_i)\gamma_1 - Y_{CN}\Gamma_N^{ER}/2 \quad \text{Equation 10}$$

In the above-mentioned equation, d/dt represents the time derivative. Further, $\rho_p$ is the film density of the polymer film. $Y_{CC}$ is the reaction probability of carbon in the polymer film with carbon in the etching gas, and $\Gamma_C$ is the flux of carbon incident on the processed surface. $Y_{OC1}$ is the reaction probability of carbon in the polymer film with oxygen in the etching gas, and $\Gamma_O$ is the flux of oxygen incident on the processed surface. $Y_{FC}$ is the reaction probability of fluorine in the etching gas with carbon in the polymer film. $Y_{iC}$ is the reaction probability of incident ions with carbon in the polymer film, and $\Gamma_i$ is the flux of the incident ions. $\gamma_1$ is an input parameter of simulation, which is larger than 0 and not more than 1. The lower coefficient $\gamma_1$ represents the lower reaction probability of incident particles with carbon and the lower removal rate for removing the volatilization amount from the polymer layer by the change in the quality of the polymer film. $Y_{CN}$ is the reaction probability of a CH bond in the polymer film with nitrogen in the outflux.

The first term on the right-hand side of the Equation 10 represents the amount of deposited polymer layers generated by etching, and the second term represents decreasing the polymer layer that is reacted with oxygen or fluorine and volatilizes. Further, the third term represents that carbon in the polymer film is reacted with nitrogen to decrease the polymer layer. The left-hand side is a value obtained by removing the volatilization amount of the second term and the third term from the depositing amount of the first term, and represents the amount of deposited polymer. Note that the polymer film thickness calculation unit 155 is an example of the protection film layer calculation unit described in the scope of claims.

In the case where a CF-based gas is used, carbon in the polymer film is reacted with secondary nitrogen generated during etching, cyan (CN) that is hard to volatilize is formed in the polymer film, and the quality of the polymer film is changed. Therefore, when ions having high energy are applied (in other words, the threshold value of reaction is low), carbon in the polymer film is emitted in the gas phase as $C_2N_2$, and the polymer film thickness is reduced. The third term in the Equation 10 represents the amount corresponding to this reduction.

The polymer film thickness calculation unit 155 supplies the calculated polymer film thickness to the output unit 170 and the dangling-bond ratio calculation unit 152.

The damage calculation unit 156 calculates the damage (crystal defect) in accordance with the damage calculation method described in Patent Literature 1. Note that the damage calculation unit 156 is an example of the crystal defect calculation unit described in the scope of claims.

The output unit 170 outputs a simulation result. For example, the polymer film thickness, etching rate, damage, and the like for each time are output as the simulation result. Note that this simulation result may be visualized by GUI. The output or visualization of the simulation result may be performed when all calculations are completed or in real-time during calculation.

Figure 2:
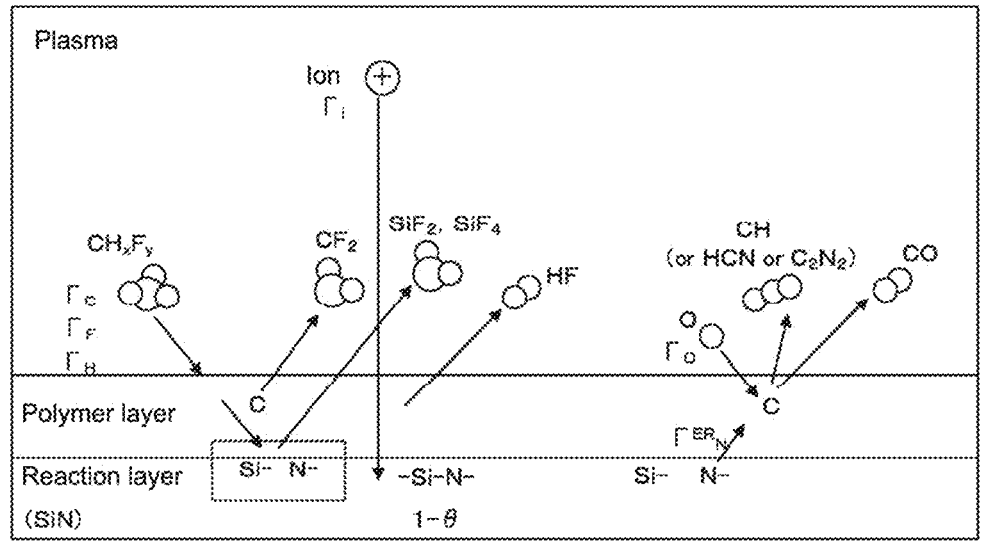
FIG. 2 A diagram for describing a surface reaction model in the first embodiment.

FIG. 2 is a diagram for describing a surface reaction model in the first embodiment. CHxFy in the etching gas is reacted with the reaction layer in the workpiece containing silicon nitride (SiN) to generate silicon difluoride ($SiF_2$), silicon tetrafluoride ($SiF_4$), and hydrogen fluoride (HF). Note that CHxFy represents a CF-based gas or CHF-based gas. Further, by the primary reaction of the etching gas with the reaction layer, polymer layers containing carbon are deposited. Then, by the secondary reaction of this polymer layer and the etching gas, carbon difluoride ($CF_2$) is generated.

Further, by the secondary reaction of the polymer layer with oxygen in the etching gas, hydrocarbon (CH), hydrogen cyanide (HCN), or carbon dinitride ($C_2N_2$) is generated. Further, by the reaction of the polymer layer with oxygen, also carbon monoxide (CO) is generated.

Figure 3:
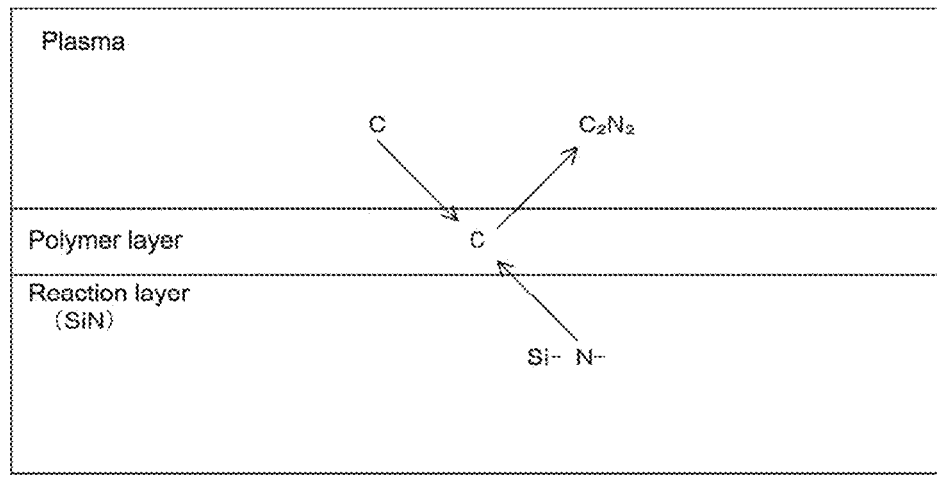
FIG. 3 A diagram for describing a simplified surface reaction model in the first embodiment.

FIG. 3 is a diagram for describing the surface reaction model of the polymer layer in the first embodiment. In the case where a CF-based gas is used, a polymer layer containing carbon is generated by etching. Then, the polymer layer is reacted with carbon in the etching gas to generate carbon dinitride ($C_2N_2$). As shown in the figure, in the case where a CF-based gas is used, it does not need to take into account the reaction of hydrogen. Therefore, "0" is set to $\Gamma_H^{**}$ in the equation 9.

[Operation Example of Simulator]

Figure 4:
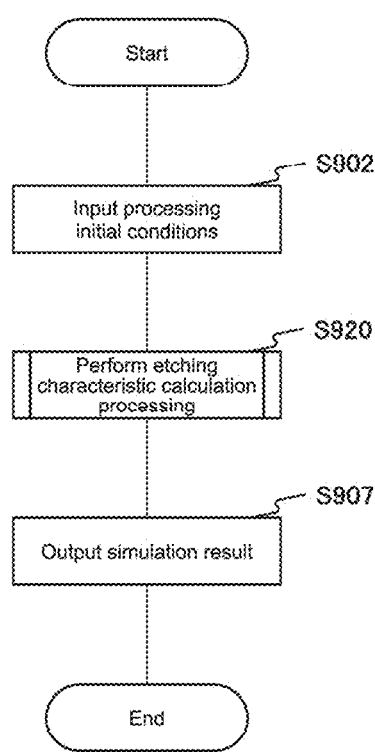
FIG. 4 A flowchart showing an example of an operation of the simulator in the first embodiment.

FIG. 4 is a flowchart showing an example of the operation of the simulator 100 in the first embodiment. This operation is started when a predetermined application for performing simulation is executed, for example.

Input data such as processing initial conditions is input to the simulator 100 (Step S902). The simulator 100 performs etching characteristic calculation processing of the workpiece (Step S920). Then, the simulator 100 outputs the simulation result (Step S907).

Figure 5:
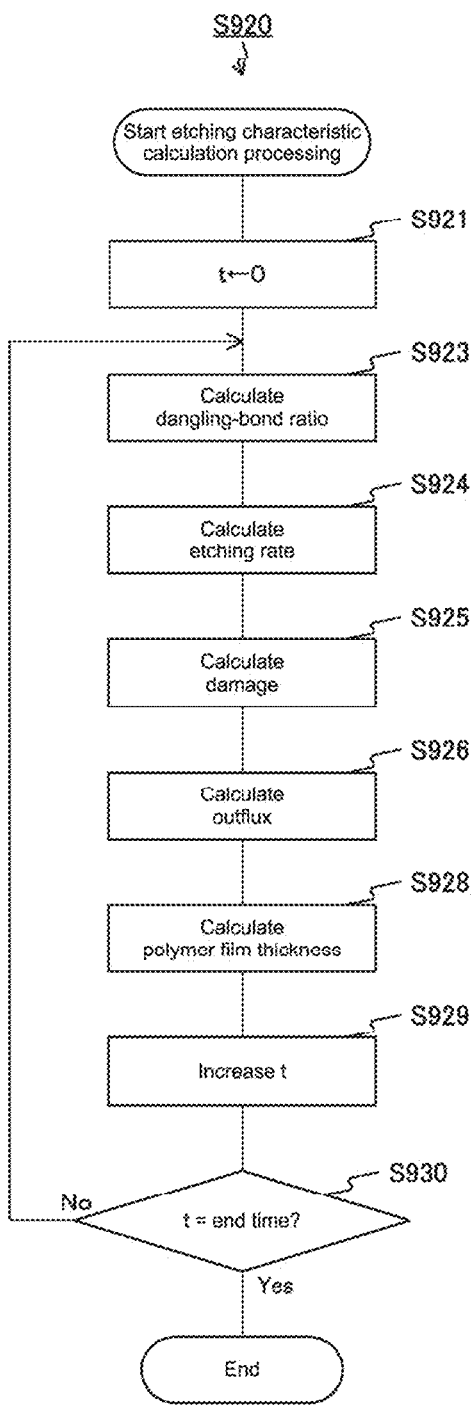
FIG. 5 A flowchart showing an example of etching characteristic calculation processing in the first embodiment.

FIG. 5 is a flowchart showing an example of etching characteristic calculation processing in the first embodiment. The simulator 100 sets an initial value (e.g., "0") to the time t (Step S921). The simulator 100 calculates the dangling-bond ratio (Step S923), and calculates the etching rate (Step S924). Further, the simulator 100 calculates damage on the basis of the etching rate and the dangling-bond ratio (Step S925). Then, the simulator 100 calculates the outflux from the dangling-bond ratio and the etching rate (Step S926). Further, the simulator 100 calculates the polymer film thickness from the outflux (Step S928).

The simulator 100 increases t by a predetermined time (Step S929), and determines whether or not t is the end time set in advance (Step S930). When t is not the end time (Step S930: No), the simulator 100 returns to Step S923. On the other hand, when t is the end time (Step S930: Yes), the simulator 100 finishes the etching characteristic calculation processing.

Figure 6:
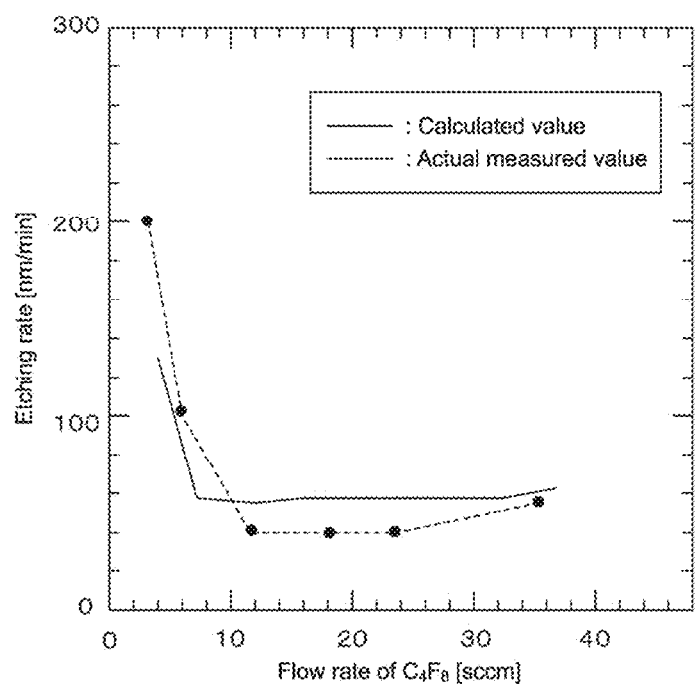
FIG. 6 A graph showing an example of a calculation result in the first embodiment.
Figure 6:
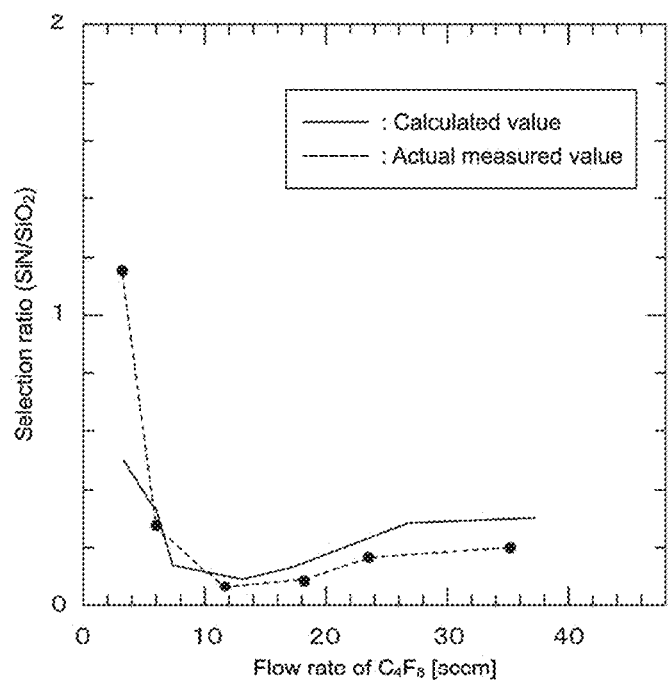

FIG. 6 is a graph showing an example of the calculation result in the first embodiment. The vertical axis shown in part a of the figure represents the etching rate, and the horizontal axis represents the flow rate of the etching gas of $C_4H_8$. The solid line represents the locus of the etching rate obtained by calculation, and the dotted lines represent the locus of the actual measured value measured by actually performing etching under the same conditions.

In the calculation, the following processing/apparatus conditions were input.

Apparatus type: CCP (Conductively Coupled Plasma) type
Applied frequency (Max/Min): 27/0.8 Megahertz (MHz)
Gas-based, flow rate: $C_4H_8/O_2/Ar$, 5 to 40/8/400 sccm
Pressure: 30 millitorr (mTorr)
Ion energy: 1450 V
Etching time: 30 seconds (s)

Under these conditions, the flux is calculated from plasma monitoring data of OES (Optical Emission Spectroscopy) or QMS (Quadrupole Mass Spectroscopy). Note that the plasma monitoring data may further include data of IRLAS (Infrared-diode Laser Absorption Spectroscopy). Further, the apparatus type may be ICP (Inductively Coupled Plasma) type, ECR (Electron Cyclotron Resonance) type, or another plasma generation mechanism. Further, the flux may be derived from, for example, the response surface function that depends on plasma simulation or processing parameter (flow rate, pressure, gas type, and power).

The dangling-bond ratio and the etching rate were calculated every 0.01 second, for example. Further, with the thickness of each slab as 0.5 nanometer (nm), calculation was performed to, for example, 14 layers of slabs (i.e., 7 nanometer of thickness) in the reaction layer. Further, with the coefficient γ1 as 0.85, calculation of the polymer film thickness was performed. By repeating these calculations to the etching end time, the etching rate for each time is obtained. As shown in part a of FIG. 6, the calculation result is capable of reproducing the tendency of the actual measured value.

Further, the vertical axis shown in b of FIG. 6 represents the selection ratio of the etching rates of silicon nitride and silicon dioxide, and the horizontal axis represents the flow rate of the etching gas of $C_4H_8$. The solid line represents the locus of the selection ratio obtained by calculation, and the dotted lines represent the locus of the actual measured value measured by actually performing etching under the same conditions. As shown in b of the figure, also the selection ratio can be reproduced.

As described above, according to the first embodiment of the present technology, it is possible to precisely obtain etching characteristics in etching of a workpiece containing nitrogen because the amount of nitrogen that is reacted with the polymer layer is obtained, and the volatilization amount obtained from the amount of nitrogen is removed from the polymer layer to obtain the film thickness.

<2. Second Embodiment>

In the above-mentioned first embodiment, an etching gas containing no hydrogen is assumed to be used. However, it is also possible to use an etching gas containing hydrogen, such as a CHF-based gas. The simulator 100 in a second embodiment is different from that in the first embodiment in that etching characteristics in etching using an etching gas containing hydrogen are estimated.

Figure 7:
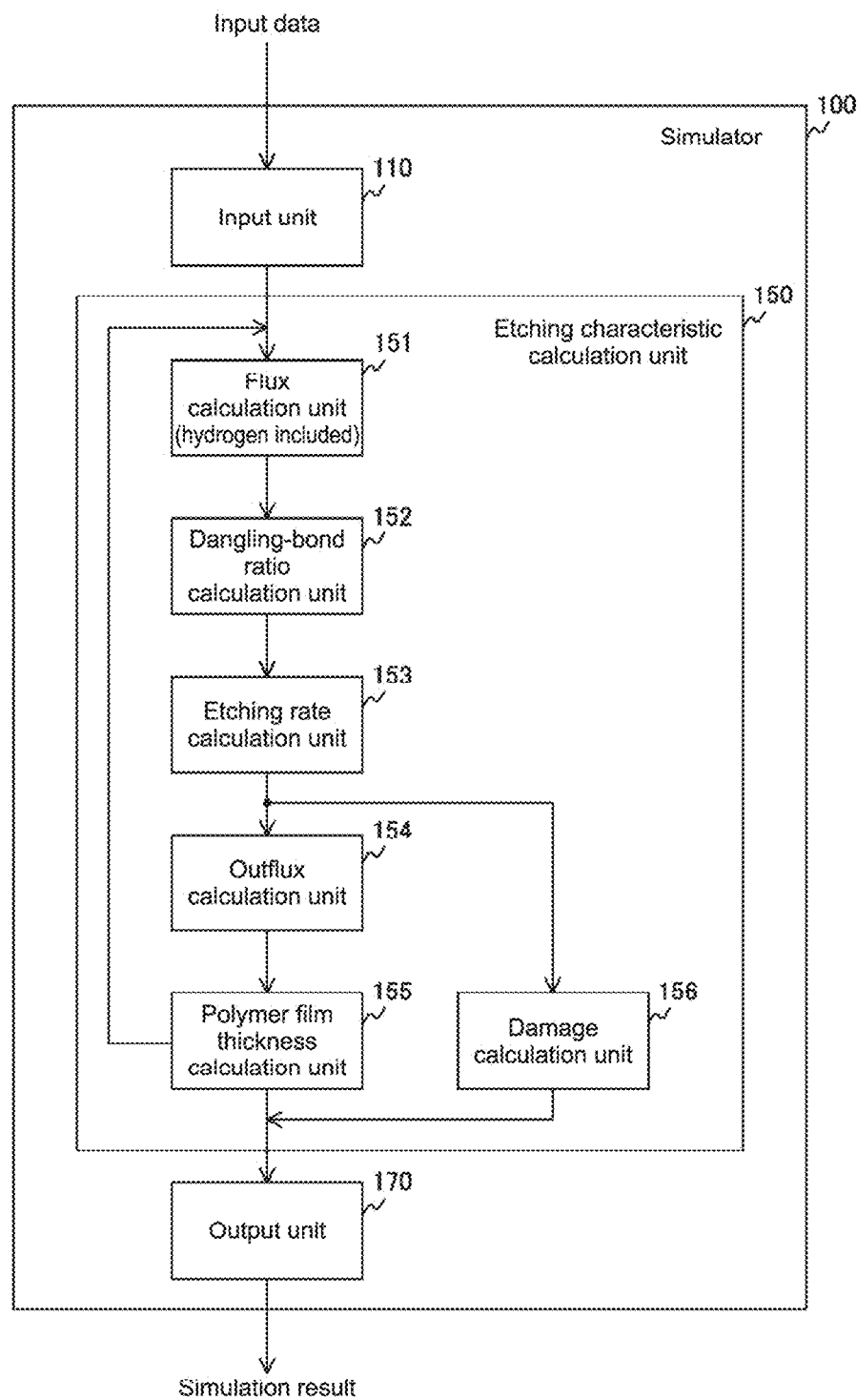
FIG. 7 A block diagram showing a configuration example of a simulator in a second embodiment.

FIG. 7 is a block diagram showing a configuration example of the simulator 100 in the second embodiment. In the second embodiment, an etching gas containing hydrogen, such as a CFH-based gas, is used. Further, the flux calculation unit 151 in the second embodiment is different from that in the first embodiment in that the flux of hydrogen is calculated.

The flux calculation unit 151 calculates a flux $\Gamma_H^{*}$ (hydrogen flux left from the reaction with N, O, and F) of hydrogen in an etching gas, which is reacted with the polymer layer. This flux $\Gamma_H^{*}$ is obtained by using, for example, the following equations.

$$\Gamma_H^{*} = (1 - Y_{NH})\Gamma_H^{} \quad \text{Equation 11}$$

$$\Gamma_H^{**} = (1 - Y_{HO})\Gamma_H^{*} \quad \text{Equation 12}$$

$$\Gamma_H^{*} = (1 - Y_{HF})\Gamma_H \quad \text{Equation 13}$$

In the Equation 11, $Y_{NH}$ is the reaction probability of nitrogen with hydrogen. In the Equation 12, $Y_{HO}$ is the reaction probability of hydrogen with oxygen. In the Equation 13, $Y_{HF}$ is the reaction probability of hydrogen with fluorine. Further, $\Gamma_H$ is the flux of hydrogen incident on the processed surface.

The flux calculation unit 151 supplies the calculated $\Gamma_H^{*}$ to the polymer film thickness calculation unit 155, and the $\Gamma_H^{}$ to the outflux calculation unit 154.

The outflux calculation unit 154 in the second embodiment calculates the outflux by using the Equation 9 on the basis of $\Gamma_H^{}$ supplied from the flux calculation unit 151. Further, the polymer film thickness calculation unit 155 in the second embodiment is different from that in the first embodiment in that the polymer film thickness calculation unit 155 compares the flux $\Gamma_H^{*}$ of hydrogen with the outflux $\Gamma_N^{ER}$, and calculates the polymer film thickness on the basis of the comparison result.

In the case where the value of $\Gamma_H^{***}/\Gamma_N^{ER}$ is "0," i.e., the etching has contains no hydrogen, the polymer film thickness is obtained by using the Equation 10 similarly to the first embodiment.

Further, in the case where the value of $\Gamma_H^{***}/\Gamma_N^{ER}$ is larger than "0" and not more than "1," i.e., the etching gas contains hydrogen and the flux of hydrogen is not more than the outflux, the polymer film thickness is obtained by using, for example, the following equation.

[Math. 7]

$$\rho_P \frac{dT(t)}{dt} = Y_{CC}\Gamma_C - (Y_{OC1}\Gamma_O + Y_{FC}\Gamma_F + Y_{iC}\Gamma_i)\gamma_2 - Y_{HCN}\Gamma_H^{*} - (1 - Y_{HCN})\Gamma_H^{*}Y_{CH} - (\Gamma_N^{ER} - Y_{HCN}\Gamma_H^{***})Y_{CN}/2 \quad \text{Equation 14}$$

In the Equation 14, $Y_{HCN}$ is the reaction probability of a CH bond in the polymer film with nitrogen, and $Y_{CN}$ is the reaction probability of carbon in the polymer film with nitrogen. $\gamma_2$ is a parameter larger than 0 and not more than 1. The lower $\Gamma_2$ represents the lower removal rate for removing the volatilization amount from the polymer layer.

In the case where the flux of hydrogen is not more than the outflux of nitrogen, hydrogen is reacted with fluorine on the surface of the polymer film and volatilizes as hydrogen fluoride. Further, the left hydrogen is reacted with incident oxygen, and volatilizes as hydroxide (OH). The flux of the left hydrogen corresponds to the $\Gamma_H^{**}$ in the Equation 11. A part of this hydrogen is reacted with nitrogen, the left hydrogen forms an active C—H bond with carbon in the polymer film, and nitrogen acts thereon. Accordingly, hydrogen cyanide (HCN) is formed by the reaction probability $Y_{HCN}$, and volatilizes. This volatilization amount corresponds to the third term on the right-hand side of the Equation 14.

Further, the left hydrogen is eventually reacted with carbon in the polymer, and volatilizes as hydrocarbon (CH). This volatilization amount corresponds to the fourth term on the right-hand side of the Equation 13. On the other hand, the left nitrogen is reacted with carbon in the polymer, and volatilizes as carbon dinitride ($C_2N_2$). This volatilization amount corresponds to the fifth term on the right-hand side of the Equation 14.

Further, in the case where the value of $\Gamma_H^{***}/\Gamma_N^{ER}$ is larger than "1," i.e., the etching gas contains hydrogen and the flux of hydrogen is more than the outflux of nitrogen, the polymer film thickness is obtained by using, for example, the following equation.

[Math. 8]

$$\rho_P \frac{dT(t)}{dt} = Y_{cc}\Gamma_C - (Y_{OC1}\Gamma_O + Y_{FC}\Gamma_F + Y_{iC}\Gamma_i)\gamma_3 - Y_{HCN}\Gamma_N^{ER} - (\Gamma_H^{***} - Y_{HCN}\Gamma_N^{ER})Y_{CH} - (1 - Y_{HCN})\Gamma_N^{ER}Y_{CN}/2 \quad \text{Equation 15}$$

In the Equation 15, $\gamma_3$ is a coefficient larger than 0 and not more than 1. The lower $\gamma_3$ represents the lower removal rate for removing the volatilization amount from the polymer layer.

In the case where the flux of hydrogen is more than the outflux, hydrogen is reacted with fluorine on the surface of the polymer film, and volatilizes as hydrogen fluoride. Further, the left hydrogen is reacted with incident oxygen, and volatilizes as hydroxide (OH). The flux of the left hydrogen corresponds to $\Gamma_H^{**}$ in the Equation 11. A part of this hydrogen is reacted with nitrogen, and the left hydrogen forms an active C—H bond with carbon in the polymer film. Nitrogen acts thereon, and thus, hydrogen cyanide (HCN) is formed by the reaction probability $Y_{HCN}$, and volatilizes. This volatilization amount corresponds to the third term on the right-hand side of the Equation 14. The nitrogen left from the reaction is reacted with carbon in the polymer film, and volatilizes as carbon dinitride ($C_2N_2$). This volatilization amount corresponds to the fifth term on the right-hand side of the Equation 13. On the other hand, the left hydrogen is eventually reacted with carbon in the polymer film, and volatilizes as hydrocarbon (CH). This volatilization amount corresponds to the fourth term on the right-hand side of the Equation 14.

As described above, the polymer film thickness calculation unit 155 selects the equation for calculating the polymer film thickness depending on the ratio of the flux of hydrogen to the outflux. Accordingly, even in the case where the ratio of the flux of hydrogen to the outflux is changed with time, it is possible to precisely calculate the polymer film thickness. Accordingly, the simulator 100 is capable of calculating etching characteristics with high precision.

Note that although the calculation equation is selected depending on the ratio of the flux of hydrogen to the outflux, it is not limited thereto. For example, the difference between these fluxes is obtained, and the calculation equation may be selected depending on the difference.

Figure 8:
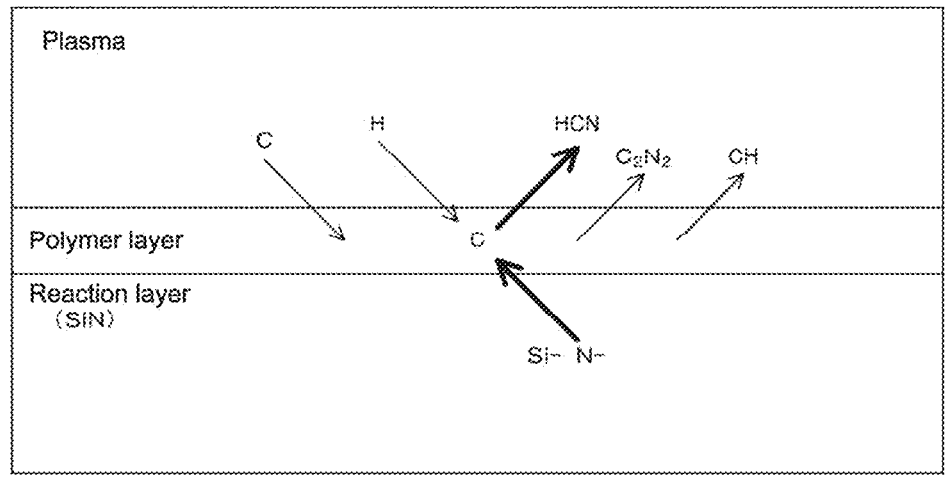
FIG. 8 A diagram for describing a simplified surface reaction model in the second embodiment.
Figure 8:
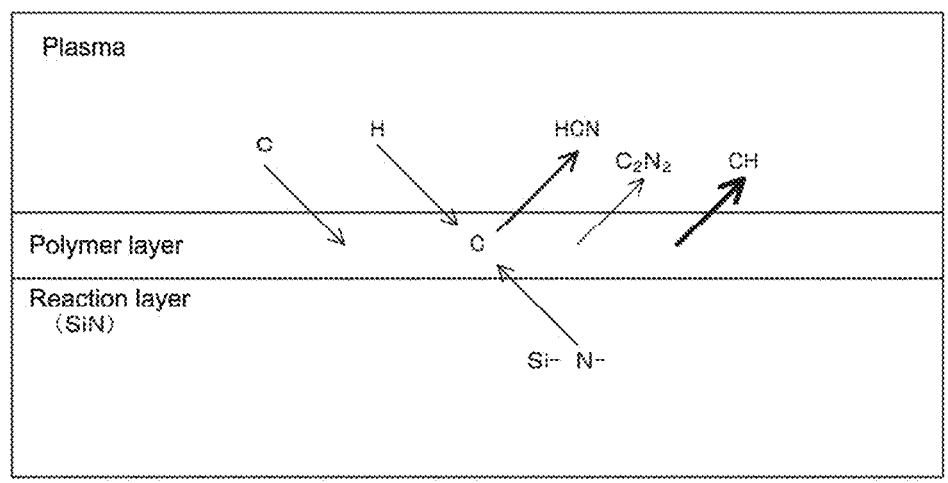

FIG. 8 is a diagram for describing the surface reaction model of the polymer film in the second embodiment. Part a in the figure represents a diagram for describing the surface reaction model in the case where the flux of hydrogen is not more than the outflux. In the case where a CHF-based gas is used, a polymer layer containing carbon is formed by etching. Then, hydrogen in the etching gas is reacted with the polymer layer to produce hydrogen cyanide (HCN). Further, the polymer layer is reacted with carbon in the etching gas to produce carbon dinitride ($C_2N_2$). Further, hydrogen in the etching gas is reacted with the polymer layer to produce hydrocarbon (CH). In the case where the flux of hydrogen is not more than the outflux, the volatilization amount of hydrogen cyanide (HCN) is particularly increased.

Part b of FIG. 8 represents a diagram for describing the surface reaction model in the case where the flux of hydrogen is more than the outflux of nitrogen. Also in this case, a polymer layer containing carbon is formed, and hydrogen cyanide (HCN), carbon dinitride ($C_2N_2$), and hydrocarbon (CH) are produced. Between them, the volatilization amount of hydrocarbon (CH) is particularly increased.

Figure 9:
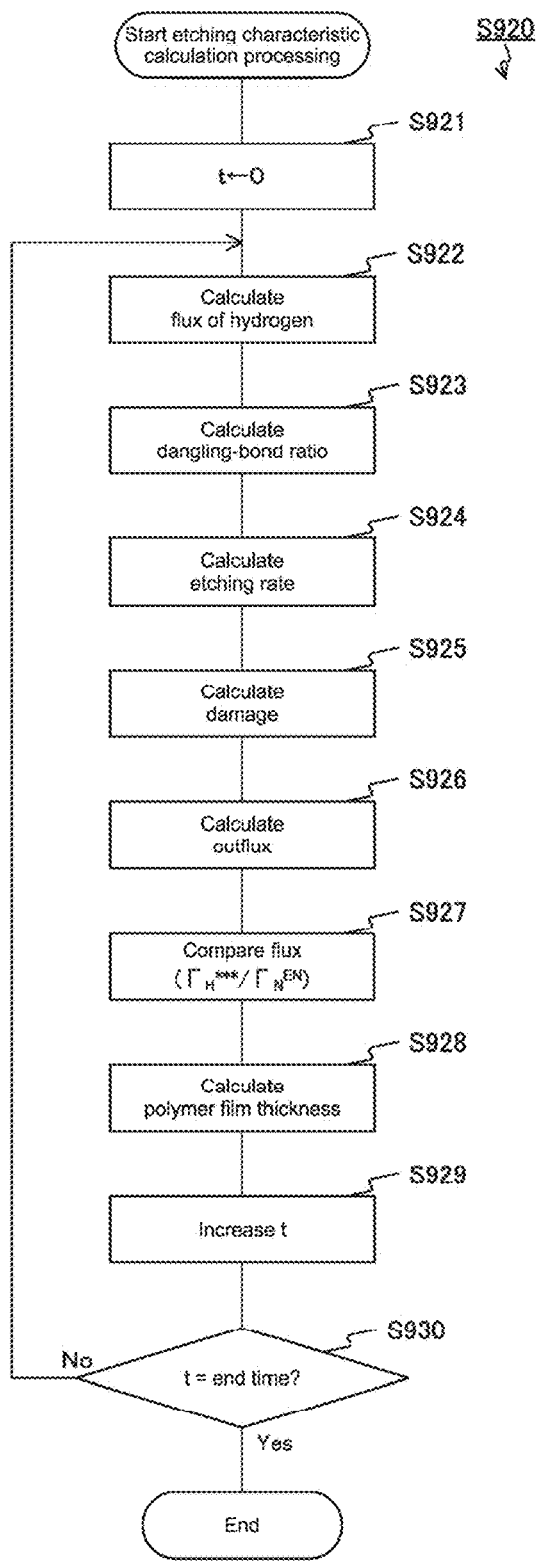
FIG. 9 A flowchart showing an example of etching characteristic calculation processing in the second embodiment.

FIG. 9 is a flowchart showing an example of etching characteristic calculation processing in the second embodiment. The etching characteristic calculation processing in the second embodiment is different from that in the first embodiment in that Steps S922 and S927 are further performed.

The simulator 100 calculates the flux $\Gamma_H{}^{*}$ of hydrogen (Step S922) after the initialization of t (Step S921). The simulator 100 performs Steps S923 to S926, and compares the flux $\Gamma_H{}^{*}$ of hydrogen with the outflux (Step S927). Then, the simulator 100 calculates the polymer film thickness (Step S928) by using the calculation equation depending on the comparison result.

The simulator 100 increases t by a predetermined time (Step S929), and determines whether or not t is the end time (Step S930). When t is not the end time (Step S930: No), the simulator 100 returns to Step S922. On the other hand, when t is the end time (Step S930: Yes), the simulator 100 finishes the etching characteristic calculation processing.

Figure 10:
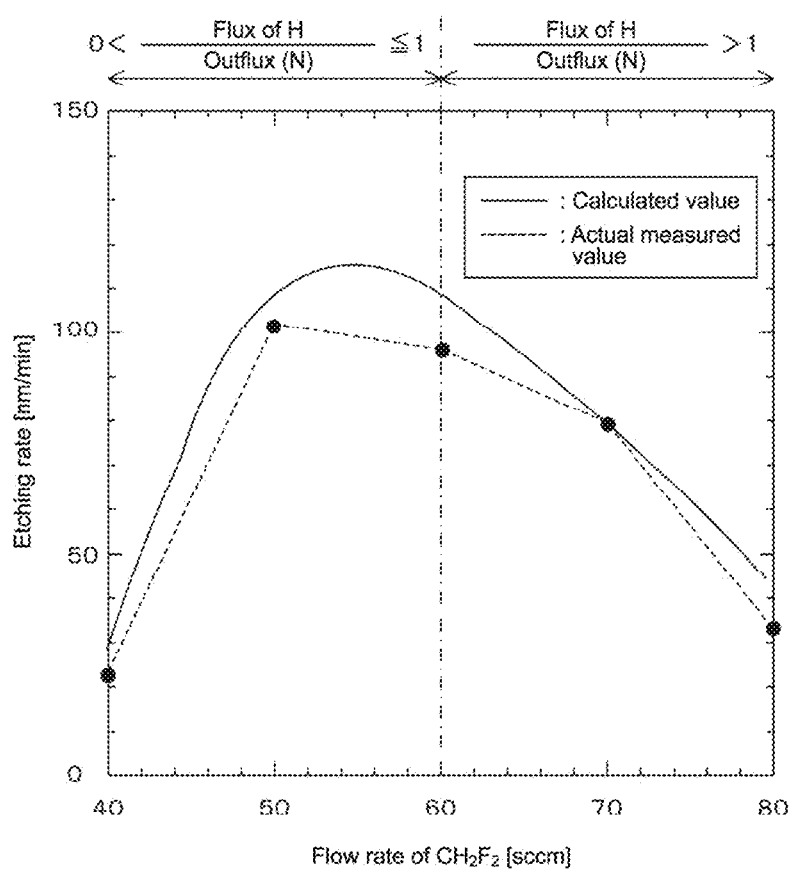
FIG. 10 A graph showing an example of a calculation result in the second embodiment.

FIG. 10 is a graph showing an example of the calculation result in the second embodiment. The vertical axis shown in the figure represents the etching rate, and the horizontal axis represents the flow rate of the etching gas of $CH_2F_2$, which is a CHF-based gas. The solid line represents the locus of the etching rate obtained by calculation, and the dotted lines represent the locus of the actual measured value measured by actually performing etching under the same conditions.

In the calculation, the following processing/apparatus conditions were input.
Apparatus type: CCP type
Applied frequency (Max/Min): 60/2 Megahertz (MHz)
Gas-based, flow rate: $CH_2F_2/O_2/Ar$, 40 to 80/30/300 sccm
Pressure: 20 millitorr (mTorr)
Ion energy: 350 V
Etching time: 20 seconds (s)

In the range of the flow rate of $CH_2F_2$ of not more than 60 sccm, the flux of H (hydrogen) is not more than the outflux. Therefore, the polymer film thickness was calculated by using the Equation 14 to obtain the etching rate. On the other hand, in the range of the flow rate of $CH_2F_2$ of more than 60 sccm, the flux of H was more than the outflux. Therefore, the equation was selected to the Equation 15 to calculate the polymer film thickness, and the etching rate was obtained. In the range of the flux of H more than the outflux, the number of CH bonds on the surface of the polymer film is increased, thereby reducing the reaction probability of fluorine or oxygen with carbon. Taking into account this effect, a value smaller than $\gamma_2$ was set to $\gamma_3$ to perform calculation. By selecting the calculation equation in such a way, it is possible to reproduce the change tendency of actual etching characteristics, as illustrated in FIG. 10.

Note that the simulator 100 obtains etching characteristics in etching of an $Si_3N_4$ film by a CHF-based gas. However, the combination of the etching gas and the workpiece is not limited as long as the etching gas, the polymer layer, and the workpiece contain at least carbon, hydrogen, and nitrogen. For example, the simulator 100 may obtain etching characteristics in etching of an organic film by an $N_2/H_2$ gas or a film having a low dielectric constant (so-called Low-k). Specifically, for example, the following processing/apparatus conditions are input.
Apparatus type: CCP type
Applied frequency (Max/Min): 60/27 Megahertz (MHz)
Gas-based, flow rate: $H_2/N_2$, 200/300 sccm
Pressure: 40 millitorr (mTorr)
Source/bias power: 500/200 watt (w)
Ion energy: 600 V
Etching time: 20 seconds (s)

As described above, according to the second embodiment, because the amount of hydrogen and the amount of nitrogen are compared with each other, and the polymer film thickness is obtained on the basis of the comparison result, it is possible to precisely obtain the polymer film thickness even in the case where the ratio between the amount of hydrogen and the amount of nitrogen is changed. Accordingly, it is possible to precisely obtain etching characteristics.

<3. Third Embodiment>

Although the polymer film thickness, the etching rate, and the dame are obtained is the above-mentioned second embodiment, it is also possible to obtain the shape of the workpiece that has been etched from the etching rate. The simulator 100 in the third embodiment is different from that in the second embodiment in that the shape of the workpiece that has been etched is further obtained.

Figure 11:
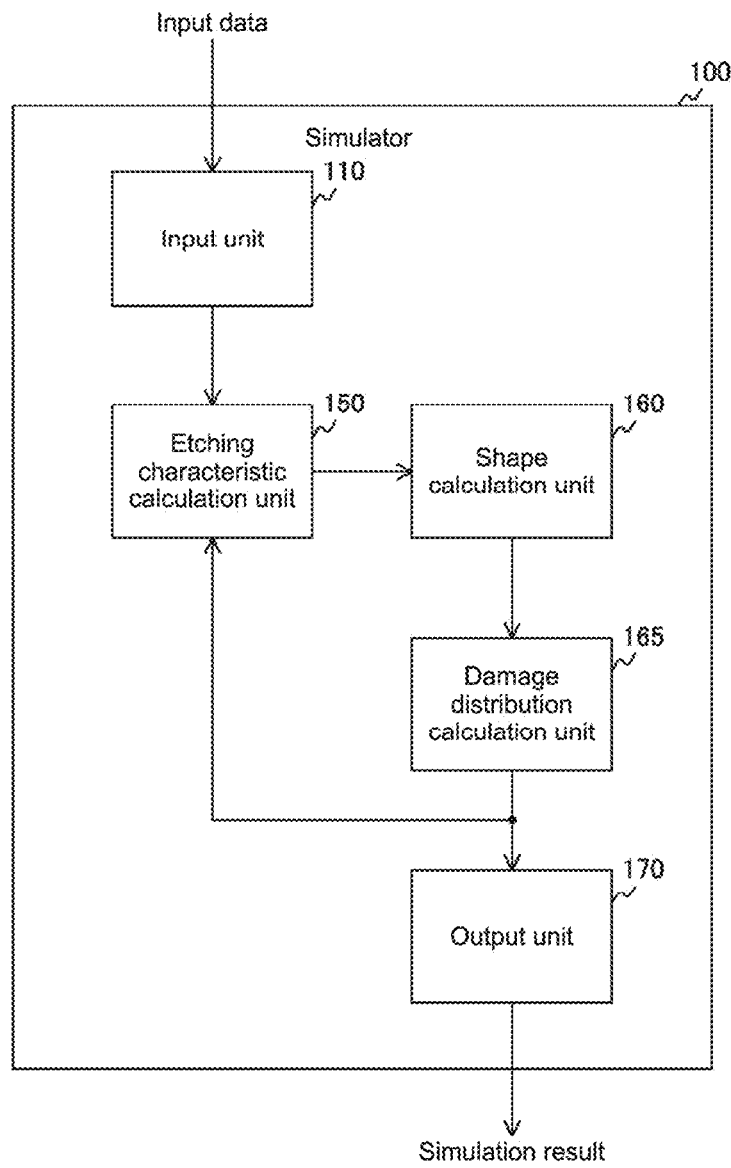
FIG. 11 A block diagram showing a configuration example of a simulator in a third embodiment.

FIG. 11 is a block diagram showing a configuration example of the simulator 100 in the third embodiment. The simulator 100 in the third embodiment is different from that in the second embodiment in that the simulator 100 further includes a shape calculation unit 160 and a damage distribution calculation unit 165.

The shape calculation unit 160 estimates the shape of the workpiece that has been etched by calculation on the basis of the etching rate. The shape is obtained by, for example, a voxel method in which a non-workpiece is divided into many cubic voxels and the progress of the shape is calculated in units of voxels. This shape calculation unit 160 supplies the calculation result to the damage distribution calculation unit 165. The damage distribution calculation unit 165 performs calculation of damage distribution with the method described in Japanese Patent Application No. 2013-014556, for example. The damage distribution calculation unit 165 supplies the calculation result to the etching characteristic calculation unit 150 and the output unit 170. Note that the damage calculation unit 156 and the shape calculation unit 160 is an example of the processing shape/crystal defect calculation unit described in the scope of claims.

Note that although the simulator 100 estimates the shape with a voxel method, it is not limited thereto. The simulator 100 may estimate the shape with, for example, a string method or a level set method instead of the voxel method. The dimension of the calculation may be any of two dimension and three dimension.

Figure 12:
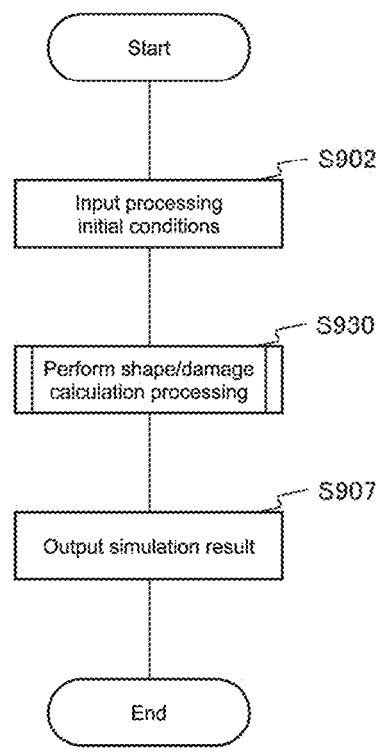
FIG. 12 A flowchart showing an example of an operation of the simulator in the third embodiment.

FIG. 12 is a flowchart showing an example of the operation of the simulator 100 in the third embodiment. The operation of the simulator 100 in the third embodiment is different from that in the second embodiment in that shape/damage calculation processing S930) is performed instead of the etching characteristic calculation processing (Step S920).

Figure 13:
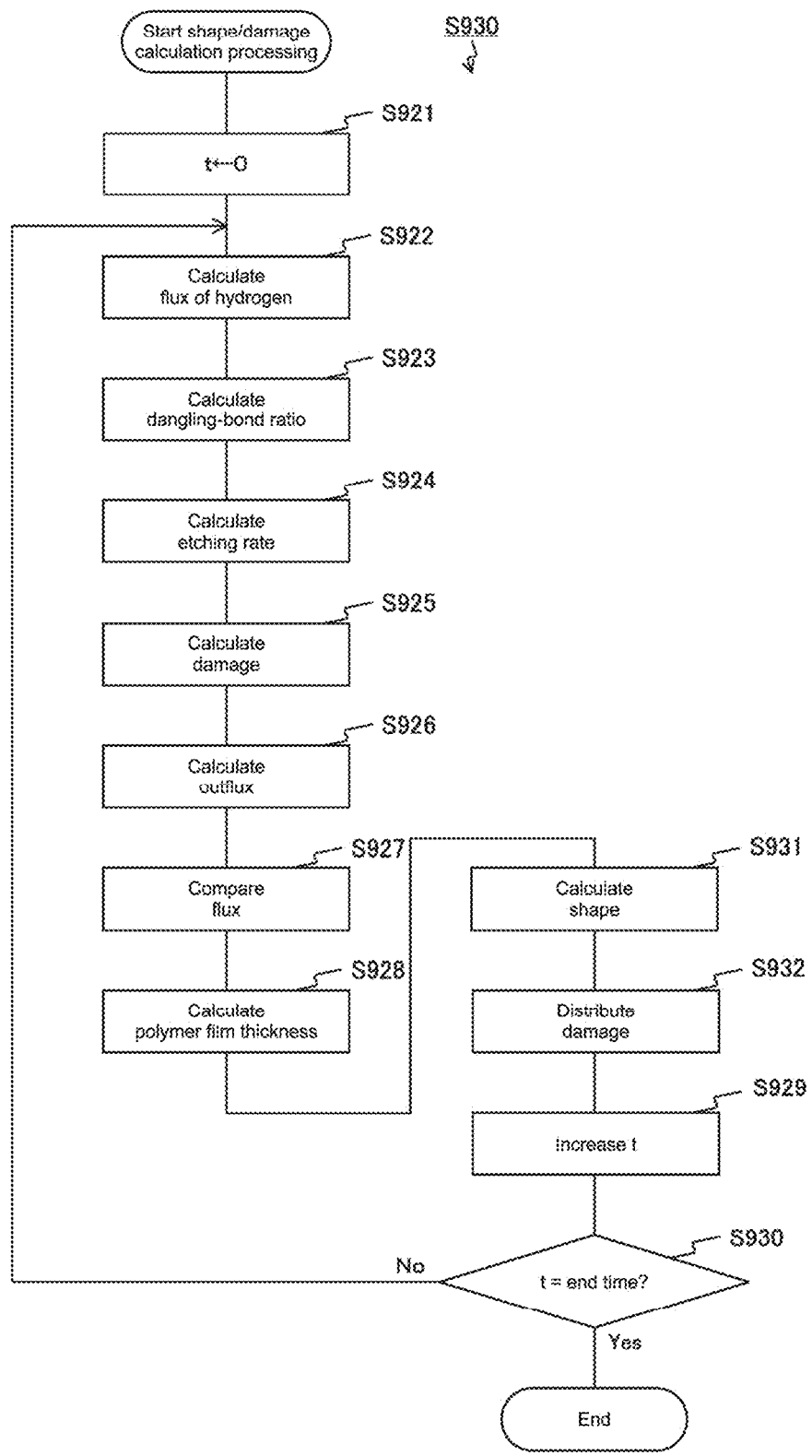
FIG. 13 A flowchart showing an example of shape/damage calculation processing in the third embodiment.

FIG. 13 is a flowchart showing an example of the shape/damage calculation processing in the third embodiment. This shape/damage calculation processing is similar to the damage calculation processing in the second embodiment except that Steps S931 and S932 are further performed.

The simulator 100 calculates the shape of the workpiece (Step S931) after the calculation of the polymer film thickness (Step S928), distributes damage (Step S932), and increases t by a predetermined time (Step S929).

Figure 14:
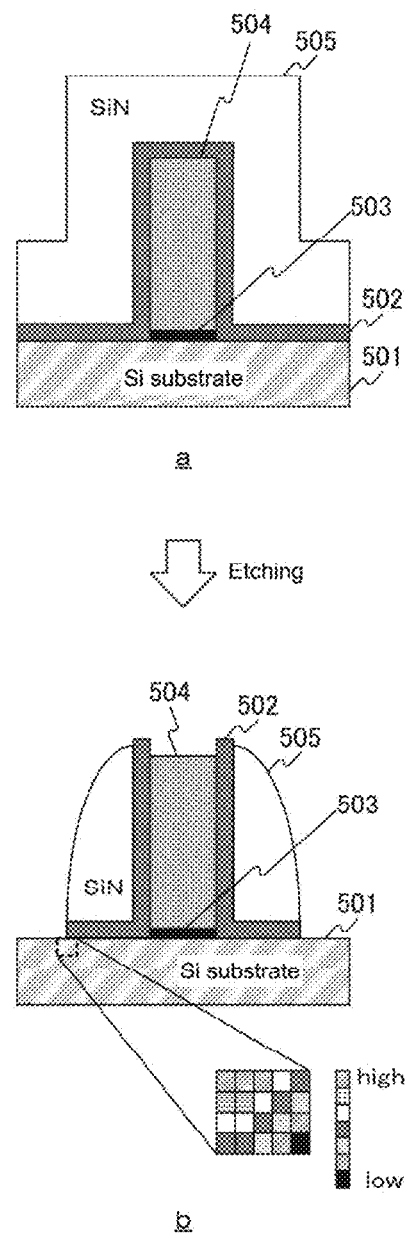
FIG. 14 An example of a cross-sectional view of a workpiece in the third embodiment before and after etching.

FIG. 14 is an example of a cross-sectional view of the workpiece before and after sidewall etching of a transistor in the third embodiment. Part a of the figure represents a cross-sectional view before the etching, and part b of the figure is a cross-sectional view after the etching.

The voxel size is, for example, 1 nanometer (nm). Further, a transistor formed of polysilicon was used as the workpiece. After a gate having a width of 60 nanometer and a height of 150 nanometer was processed, a silicon dioxide film and a silicon nitride film were deposited, etch back step of the silicon nitride film was assumed, and calculation of the shape after sidewall processing and distribution of damage caused at that time was performed. The processing apparatus is a CCP etching apparatus, and the processing conditions are described below. Further, the aperture ratio in the vicinity of the sidewall pattern is 100%. Note that the aperture ratio is a ratio of the area that has been etched to the surface area of the workpiece.

Gas-based, flow rate: $CF_4/O_2/CHF_3$, 200/5/100 sccm
Source/bias power: 700/400 watt (w)
Pressure: 40 millitorr (mTorr)
Lower electrode temperature: 40° C.

For the calculation of the flux directly on the pattern, plasma simulation described in Japanese Patent Application Laid-open No. 2013-115354, which handles the plasma/wall interaction was used. Note that the actual measured value such as plasma monitoring or response surface function may be used.

Further, taking into account the dependence on the aperture ratio of the millimeter-order chip level in the vicinity of the target and the effect of redeposition of a reaction product on the pattern by etching, calculation of the flux incident on the pattern within a radius of 20 millimeter was performed. The normal line used for the shape progression after the derivation of the etching rate was derived from the flux vector by using, for example, the method described in Japanese Patent Application Laid-open No. 2014-29982. In this surface reaction model, the etching rate and damage were calculated, the voxel in the normal line direction was removed in the area corresponding to the etching rate, the damage amount was distributed to the vicinity, and the progression of the shape was repeatedly performed until the etching was finished. As a result, the shape/damage distribution shown in part b of FIG. 14 was obtained.

Note that the application pattern is not limited to the sidewall. It can be applied to various kinds of pattern processing of a mask, a lens, and the like. Further, although the simulator 100 calculates the two-dimensional shape in FIG. 14, the three-dimensional shape may be calculated.

As described above, according to the third embodiment, because the simulator 100 estimates the shape and damage of the workpiece after the etching from the etching rate, it is possible to precisely perform processing in a desired specification when processing is performed by etching.

<4. Fourth Embodiment>

Although the simulator 100 estimates the etching rate and the like with a constant density of the etching gas, a constant ion energy distribution, and a constant aperture ratio in the above-mentioned third embodiment, they may be further estimated. The simulator 100 in the fourth embodiment is different from that in the third embodiment in that the simulator 100 estimates the density of the etching gas, the ion energy distribution, the aperture ratio, and the like.

Figure 15:
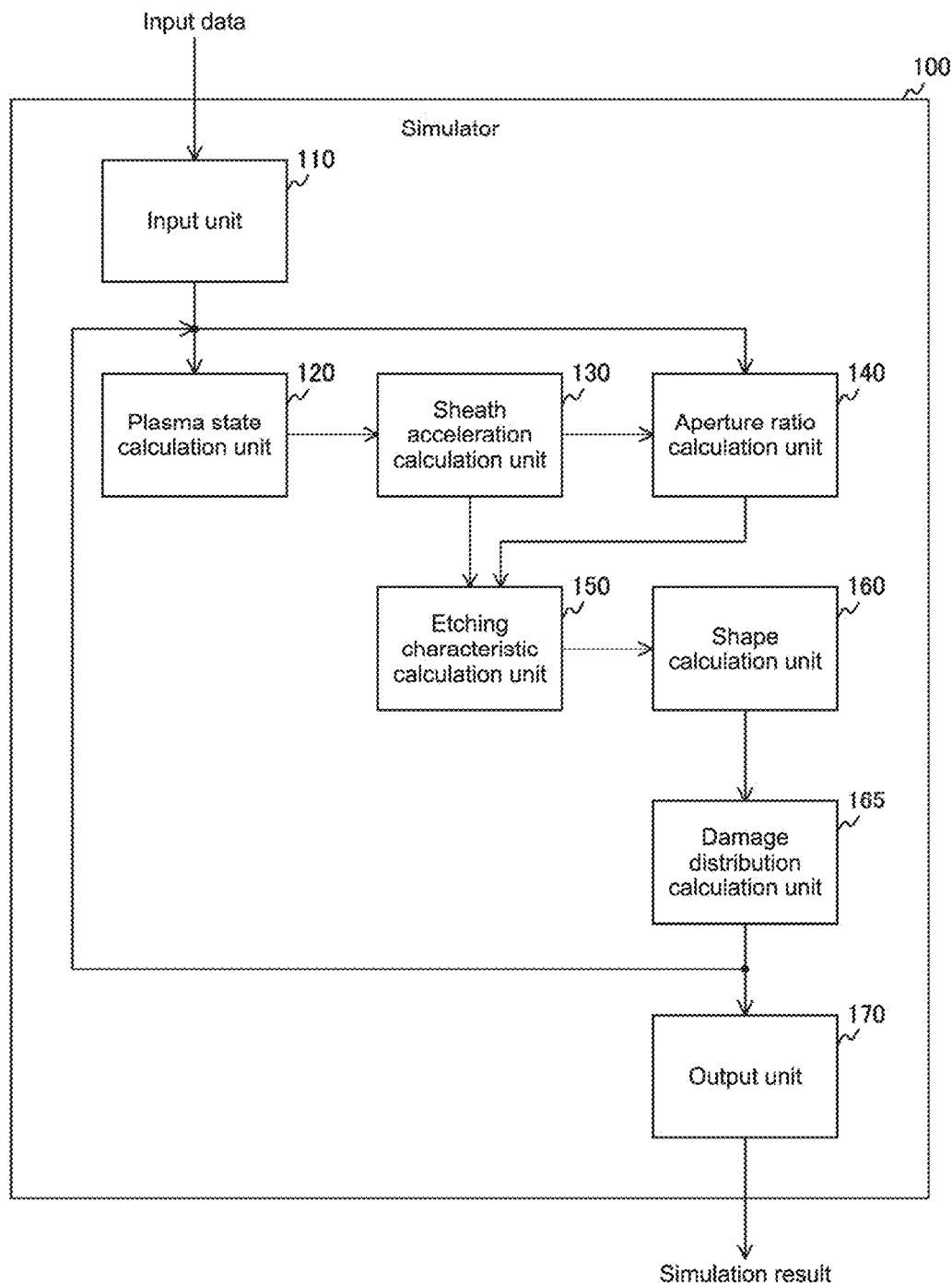
FIG. 15 A block diagram showing a configuration example of a simulator in a fourth embodiment.

FIG. 15 is a block diagram showing a configuration example of the simulator 100 in the fourth embodiment. The simulator 100 in the fourth embodiment is different from that in the third embodiment in that the simulator 100 further includes a plasma state calculation unit 120, a sheath acceleration calculation unit 130, and an aperture ratio calculation unit 140.

In the fourth embodiment, recipe information, apparatus information, calculation parameter, GDS (Graphic Data System) data, film thickness information, and the like are input as input data.

The plasma state calculation unit 120 calculates the parameter (gas density, etc.) representing the state of plasma. This plasma state calculation unit 120 calculates the density of each gas type (ion, radial, and the like) in bulk plasma on the basis of initial conditions, and supplies the calculation result to the sheath acceleration calculation unit 130. The calculation of the gas density is performed with, for example, the step described in Japanese Patent No. 5397215.

The sheath acceleration calculation unit 130 calculates the energy distribution of ions and ion incidence angle. This sheath acceleration calculation unit 130 calculates the energy distribution and incidence angle distribution to the pattern of ions that are generated by bulk plasma and accelerated in the sheath in the final state on the basis of the gas density, the gas pressure, and the applied power. These calculations are performed by, for example, the step described in M. J. Kushner, Distribution of ion energies incident on electrodes in capacitively coupled discharges, J. Appl. Phys.

The ion energy distribution is represented by, for example, an ion energy distribution function (IEDF). Further, the ion incidence angle is represented by an ion angular distribution function (IADF). For these distribution functions, database obtained from actual measurement or the like may be used. The sheath acceleration calculation unit 130 supplies the calculation result to the etching characteristic calculation unit 150.

The aperture ratio calculation unit 140 calculates the aperture ratio. This aperture ratio calculation unit 140 calculates the wafer aperture ratio and semi-local aperture ratio from CDS data, film thickness information, and the like. Note that the wafer aperture ratio is the aperture ratio of the entire wafer in the case where the wafer is the workpiece. Further, the semi-local aperture ratio is the aperture ratio of the chip level formed in the wafer. The calculation of these aperture ratios is performed by, for example, the step described in Japanese Patent No. 5440021. The aperture ratio calculation unit 140 supplies the calculation result to the etching characteristic calculation unit 150.

This etching characteristic calculation unit 150 in the fourth embodiment calculates various kinds of fluxes such as the outflux and the incident flux on the basis of the aperture ratio. Further, the etching characteristic calculation unit 150 in the fourth embodiment calculates the dangling-bond ratio and the etching rate on the basis of the calculation result supplied from the sheath acceleration calculation unit 130.

Figure 16:
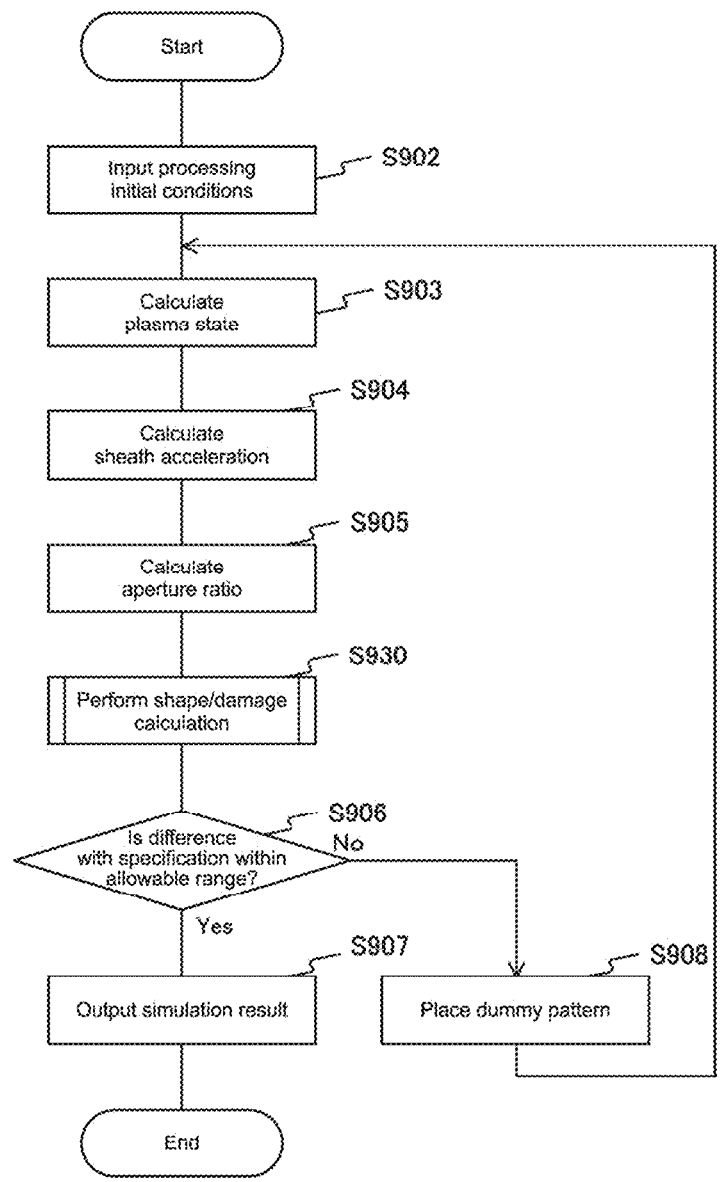
FIG. 16 A flowchart showing an example of an operation of the simulator in the fourth embodiment.

FIG. 16 is a flowchart showing an example of the operation of the simulator 100 in the fourth embodiment. The operation of the simulator 100 in the fourth embodiment is different from that in the first embodiment in that Steps S903 to S905, S906, and S908 are further performed.

After the processing initial conditions are input (Step S902), the simulator 100 calculates the plasma state (S903), and calculates the sheath acceleration (Step S904). Then, the simulator 100 calculates the aperture ratio (Step S905), and performs the shape/damage calculation processing (Step S930).

Then, the simulator 100 compares the calculation results of the shape and damage with the expected specification to determine whether or not the difference with the specification is within an allowable range (Step S906). In the case where the difference with the specification is not within the allowable range (S906: No), the simulator 100 places a dummy pattern, for example, to change the aperture ratio (Step S908), and returns to Step S903. On the other hand, in the case where the difference with the specification is within the allowable range (S906: Yes), the simulator 100 outputs the simulation result (Step S907), and finishes the operation.

This simulator 100 is used for layout design of a semiconductor device, for example. For example, a case where a desired specification of the width of a transistor sidewall is 60 nanometer±10 is assumed. In this case, a dummy pattern covered by a resist mask is placed around the target processing in Step S908 in FIG. 16. When the aperture ratio in the chip is decreased (or increased) by the placement of the dummy pattern, the amount of reaction products from the mask, which reenter the pattern, is increased (or decreased). As a result, the sidewall width is increased (or decreased), and comes close to the desired specification.

Note that it is also possible to perform process design and OPC (Optical Proximity Correction) design in a similar method by changing the correction factor from the placement of a dummy pattern to processing conditions or mask shape.

As described above, according to the fourth embodiment, because the gas density, the ion energy distribution, the ion incidence angle, and the aperture ratio are further calculated and etching characteristics are estimated from the calculation results, it is possible to perform estimation with high precision.

<5. Fifth Embodiment>

Although etching characteristics are estimated in the above-mentioned fourth embodiment, the estimation result may be used to process the workpiece. A fifth embodiment is different from the fourth embodiment in that the estimation result of the etching rate and the like is used to further process the workpiece.

Figure 17:
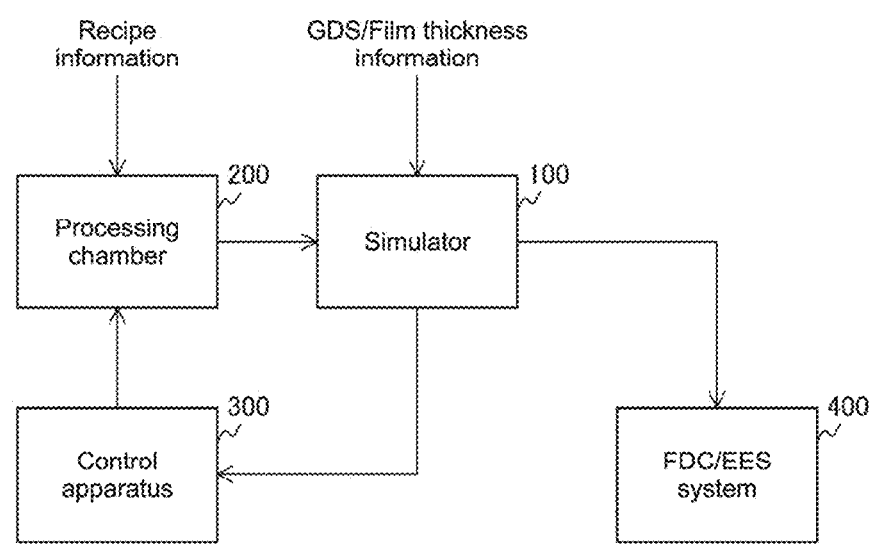
FIG. 17 A general view showing an example of a production system in a fifth embodiment.

FIG. 17 is a general view showing an example of a production system in the fifth embodiment. This production system is a system for producing a semiconductor device, and includes the simulator 100, a processing chamber 200, and a control apparatus 300. Further the production system includes a FDC (Fault Detection & Classification)/EES (Equipment Engineering System) system 400. Note that the apparatus including the simulator 100, the processing chamber 200, and the control apparatus 300 is an example of the processing apparatus described in the scope of claims.

The processing chamber 200 processes a workpiece such as a semiconductor wafer. As the processing chamber 200, for example, a CCP type apparatus is used. On the processing chamber 200, OES, QMS, IRLAS, an energy spectrum analyzer, and the like for acquiring input data necessary for simulation are mounted. They constantly monitor the plasma during processing. The sampling speed is, for example, 0.1 second (s). During processing, information acquired by them as well as processing conditions are transmitted to the simulator 100. Note that the processing chamber 200 is an example of the processing unit described in the scope of claims.

This simulator 100 in the fifth embodiment has a configuration similar to that in the above-mentioned fourth embodiment. This simulator 100 calculates the gas density, as flux, ion energy distribution, and ion incidence angle distribution on the basis of data transmitted from the processing chamber 200. In the case where the calculation time is sufficiently smaller than the actual processing time, all of them may be obtained by reactor simulation. Further, the simulator 100 uses GDS and film thickness information to calculate the aperture ratio, and calculates the shape and damage, taking into account the contribution of the aperture ratio to the flux. The aperture ratio and the flux generally have a linear relationship with each other.

In the case where the calculation result of the shape and damage is not within a desired specification, the simulator 100 changes the processing parameter in the order of the gas flow rate, gas pressure, applied power, and wafer temperature, and performs recalculation, thereby finding out correction conditions that satisfy the desired specification. As the desired specification, for example, the sidewall width is set to 60 nanometer (nm). In this case, for example, whether or not it is not within an allowable range between ±10% of the desired width is determined. Regarding the amount of damage, whether or not it is not within an allowable range of 50% of the desired amount is determined, for example.

Note that an apparatus other than a CCP type apparatus, such as an ICP (Inductively Coupled Plasma) type apparatus and ECR (Electron Cyclotron Resonance) type apparatus, may be used as the processing chamber 200 as long as it generates plasma.

When finding out correction conditions, the simulator 100 transmits the conditions to the control apparatus 300. On the other hand, in the case where the simulator 100 does not find out correction conditions, the simulator 100 generates an alert signal and transmits it to the FDC/EES system 400.

Note that in the case where the calculation time is not less than the actual processing time, the simulator 100 does not need to calculate the shape and damage during processing, and may calculate the shape and damage in advance before processing and store it in a database or the like. In this case, the processing chamber 200 only has to perform processing by using the database.

The control apparatus 300 controls the processing chamber 200. This control apparatus 300 changes the processing parameter of the processing chamber 200 on the basis of the correction conditions obtained by the simulator 100. Note that the control apparatus 300 is an example of the control unit described in the scope of claims.

The FDC/EES system 400 manages the quality of a semiconductor device, for example. When receiving an alert signal from the simulator 100, this FDC/EES system 400 causes the entire production system to be suspended.

By such production system, for example, an image sensor, a drive circuit, a signal processing circuit, and the like are produced. Further, from these devices, an electronic apparatus such as an imaging apparatus is produced.

Figure 18:
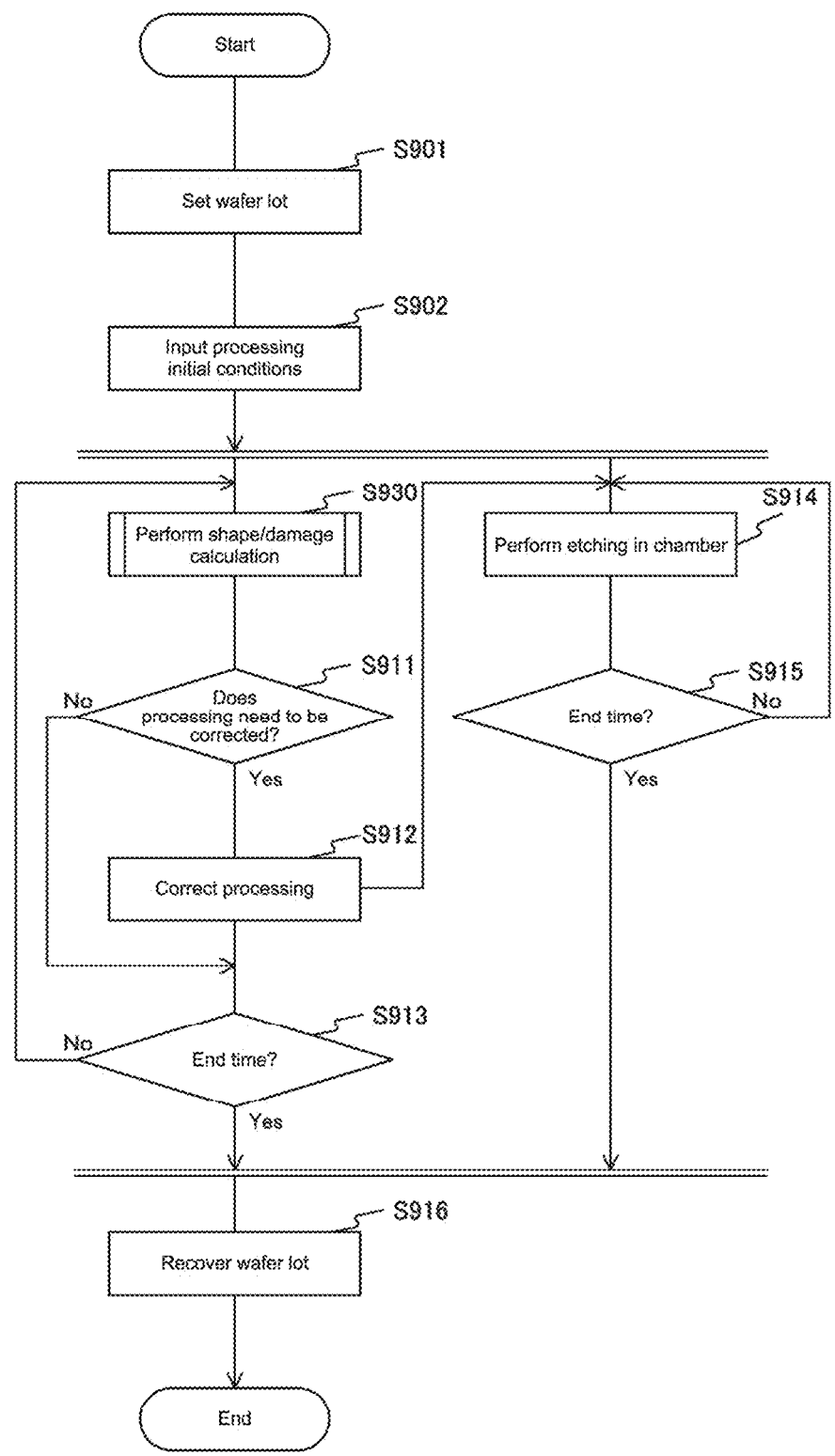
FIG. 18 A flowchart showing an example of an operation of the production system in the fifth embodiment.

FIG. 18 is a flowchart showing an example of the operation of the production system in the fifth embodiment. First, a wafer lot is set in the processing chamber 200 by a conveyor robot or a worker (Step S901), and processing initial conditions (processing recipe) are input by direct input by the worker or the like or automatically by an apparatus function (Step S902).

Note that the processing step is sidewall processing of a gate in polysilicon having a film thickness of 150 nanometer, for example. Further, as the processing initial conditions, for example, the following conditions are input.

Wafer aperture ratio: 45%
SiN etching: main etching step
$CF_4$ gas: 200 sccm
$O_2$ gas: 5 sccm
$CHF_3$ gas: 100 sccm
Source power: 700 watt (W)
Bias power: 400 watt (W)
Pressure: 40 millitorr (mTorr)
SiN etching: overetching step
$CF_3$ gas: 150 sccm
$O_2$ gas: 100 sccm
Ar gas: 500 sccm
Source power: 500 watt (W)
Bias power: 300 watt (W)
Pressure: 50 millitorr (mTorr)

The simulator 100 performs the shape/damage calculation processing (Step S930). Then, the simulator 100 compares the calculation result with a desired specification to determine whether or not the processing needs to be corrected (Step S911). In the case where the processing needs to be corrected (Step S911: Yes), the control apparatus 300 corrects the processing (Step S912).

On the other hand, in the case where the processing does not need to be corrected (step S911: Yes), the simulator 100 determines whether or not the present time is the end time of etching (step S913). In the case where it is not the end time (step S913: No), the simulator 100 returns to Step S930. In the case where it is the end time (Step S913: Yes), the simulator 100 stops the operation.

Further, the processing chamber 200 performs etching in the chamber (step S914), and determines whether or not the present time is the end time of etching (step S915). In the case where it is not the end time (Step S914: No), the processing chamber 200 returns to Step S914. In the case where it is the end time (Step S914: Yes), the processing chamber 200 stops the operation of etching.

After the operation of the simulator 100 and the processing chamber 200 is stopped, the conveyor robot or worker recovers the wafer lot (step S916). After Step S916, the production operation is finished.

Note that although the production system performs processing by plasma etching, it is not limited to the plasma etching as long as it is processing of a semiconductor using plasma. The production system may perform processing by, for example, CVD (Chemical Vapor Deposition) or PVD (Physical Vapor Deposition).

As described above, according to the fifth embodiment, because the production system performs etching of a workpiece on the basis of the estimation result of etching characteristics, it is possible to process a processed unit with high precision.

Note that the above-mentioned embodiments provide examples for embodying the present technology and the matters in the embodiments and the specifying matters in the scope of claims are associated. Similarly, the specifying matters in the scope of claims and the matters in the embodiments of the present technology, which are denoted by the identical names, have correspondence. It should be noted that the present technology is not limited to the embodiments and can be embodied by making various modifications to the embodiments without departing from its essence.

Further, the processing procedures described in the above embodiments may be construed as methods including those series of procedures or a program for causing a computer to execute those series of procedures or may be construed as a recording medium storing that program. As this recording medium, a CD (Compact Disc), an MD (Mini Disc), a DVD (Digital Versatile Disc), a memory card, and a Blu-ray (registered trademark) disc can be used, for example.

It should be noted that the effect described here is not necessarily limitative and may be any effect described in the present disclosure.

It should be noted that the present technology may take the following configurations.

(1) An etching characteristic estimation method, including:

a flux calculation step including, by an information processing apparatus, calculating a plurality of fluxes in a surface reaction model, a processed surface of a workpiece including a protection film layer and a reaction layer in the surface reaction model; and a protection film layer calculation step including, by the information processing apparatus, calculating a thickness of the protection film layer by using a calculation equation for calculating a thickness of the etched protection film layer on the basis of a removal term for describing removal of the protection film layer, the removal term being selected depending on a result of comparing the plurality of fluxes.

(2) The etching characteristic estimation method according to (1) above, in which
the plurality of fluxes include an incident flux that enters the processed surface and an outflux emitted when etching the workpiece.

(3) The etching characteristic estimation method according to (2) above, in which
the plurality of fluxes include at least fluxes of nitrogen and hydrogen.

(4) The etching characteristic estimation method according to (2) or (3) above, in which
the protection film layer calculation step includes, by the information processing apparatus, selecting one of at least three different terms as the removal term depending on the comparison result.

(5) The etching characteristic estimation method according to any one of (1) to (4) above, in which
the protection film layer calculation step includes, by the information processing apparatus, selecting the removal term depending on a difference or ratio between the plurality of fluxes.

(6) The etching characteristic estimation method according to any one of (1) to (5) above, further including
a crystal defect calculation step including, by the information processing apparatus, calculating a crystal defect on the basis of the thickness of the protection film layer.

(7) The etching characteristic estimation method according to (6) above, further including
a shape calculation step including, by the information processing apparatus, calculating a shape of the workpiece on the basis of a result of calculating the crystal defect.

(8) The etching characteristic estimation method according to any one of (1) to (8) above, further including
a plasma state calculation step including, by the information processing apparatus, calculating a density of plasma used to etch the workpiece.

(9) A program that causes a computer to execute:

a flux calculation step including, by an information processing apparatus, calculating a plurality of fluxes in a surface reaction model, a processed surface of a workpiece including a protection film layer and a reaction layer in the surface reaction model; and a protection film layer calculation step including, by the information processing apparatus, calculating, a thickness of the protection film layer by using a calculation equation for calculating a thickness of the etched protection film layer on the basis of a removal term for describing removal of the protection film layer, the removal term being selected depending on a result of comparing the plurality of fluxes.

(10) An information processing apparatus, including:

a flux calculation unit that calculates a plurality of fluxes in a surface reaction model, a processed surface of a workpiece including a protection film layer and a reaction layer in the surface reaction model; and a protection film layer calculation unit that calculates a thickness of the protection film layer by using a calculation equation for calculating a thickness of the etched protection film layer on the basis of a removal term for describing removal of the protection film layer, the removal term being selected depending on a result of comparing the plurality of fluxes.

(11) A designing method, including:

a flux calculation step including, by an information processing apparatus, calculating a plurality of fluxes in a surface reaction model, a processed surface of a workpiece including a protection film layer and a reaction layer in the surface reaction model;

a protection film layer calculation step including, by the information processing apparatus, calculating a thickness of the protection film layer by using a calculation equation for calculating a thickness of the etched protection film layer on the basis of a removal term for describing removal of the protection film layer, the removal term being selected depending on a result of comparing the plurality of fluxes;

a processing shape/crystal defect calculation step including, by the information processing apparatus, calculating a change in at least one of a processing shape and a crystal defect of the workpiece on the basis of the thickness of the protection films; and a designing step including, by the information processing apparatus, performing at least one of a processing process, an OPC (Optical Proximity Correction) design, and a layout design of a semiconductor device on the basis of the calculation result in the processing shape/crystal defect calculation step.

(12) A processing apparatus, including:

a flux calculation unit that calculates a plurality of fluxes in a surface reaction model, a processed surface of a workpiece including a protection film layer and a reaction layer in the surface reaction model;

a protection film layer calculation unit that calculates a thickness of the protection film layer by using a calculation equation for calculating a thickness of the etched protection film layer on the basis of a removal term for describing removal of the protection film layer, the removal term being selected depending on a result of comparing the plurality of fluxes;

a processing unit that performs processing of the workpiece in accordance with processing conditions of the workpiece;

a plasma state calculation unit that calculates a density of plasma used to etch the workpiece on the basis of the processing conditions;

a processing shape/crystal defect calculation unit that calculates a change in at least one of a processing shape and a crystal defect of the workpiece on the basis of the calculation result of the plasma state calculation unit and the thickness of the protection film layer; and a control unit that changes the processing conditions on the basis of the calculation result of the processing shape/crystal defect calculation unit.

(13) A production method, including:

a flux calculation unit including, by an information processing apparatus, calculating a plurality of fluxes in a surface reaction model, a processed surface of a workpiece including a protection film layer and a reaction layer in the surface reaction model;

a protection film layer calculation unit including, by the information processing apparatus, calculating a thickness of the protection film layer by using a calculation equation for calculating a thickness of the etched protection film layer on the basis of a removal term for describing removal of the protection film layer, the removal term being selected depending on a result of comparing the plurality of fluxes;

a processing step including, by a processing unit, performing processing of the workpiece in accordance with processing conditions of the workpiece;

a plasma state calculation step including, by the information processing apparatus, calculating a density of plasma used to etch the workpiece on the basis of the processing conditions;

a processing shape/crystal defect calculation step including, by the information processing apparatus, calculating a change in at least one of a processing shape and a crystal defect of the workpiece on the basis of the calculation result of the plasma state calculation unit and the thickness of the protection film layer; and a control step including, by a control unit, changing the processing conditions on the basis of the calculation result of the processing shape/crystal defect calculation step.

REFERENCE SIGNS LIST 100 simulator
110 input unit
120 plasma state calculation unit
130 sheath acceleration calculation unit
140 aperture ratio calculation unit
150 etching characteristic calculation unit
151 flux calculation unit
152 dangling-bond ratio calculation unit
153 etching rate calculation unit
154 outflux calculation unit
155 polymer film thickness calculation unit
156 damage calculation unit
160 shape calculation unit
165 damage distribution calculation unit
170 output unit
200 processing chamber
300 control apparatus
400 FDC/EES system

What is claimed is:
1. An etching characteristic estimation method, comprising:

a flux calculation step including, by an information processing apparatus, calculating a plurality of fluxes in a surface reaction model, a processed surface of a workpiece including a protection film layer and a reaction layer in the surface reaction model; and a protection film layer calculation step including, by the information processing apparatus, calculating a thickness of the protection film layer by using a calculation equation for calculating a thickness of an etched protection film layer based on a removal term for describing removal of the protection film layer, the removal term being selected depending on a comparison result of comparing the plurality of fluxes.

2. The etching characteristic estimation method according to claim 1, wherein the plurality of fluxes include an incident flux that enters the processed surface and an outflux emitted when etching the workpiece.

3. The etching characteristic estimation method according to claim 2, wherein the protection film layer calculation step includes, by the information processing apparatus, selecting one of at least three different terms as the removal term depending on the comparison result.

4. The etching characteristic estimation method according to claim 1, wherein the plurality of fluxes include at least fluxes of nitrogen and hydrogen.

5. The etching characteristic estimation method according to claim 1, wherein the protection film layer calculation step further includes, by the information processing apparatus, selecting the removal term depending on a difference or a ratio between the plurality of fluxes.

6. The etching characteristic estimation method according to claim 1, further comprising
a crystal defect calculation step including, by the information processing apparatus, calculating a crystal defect based on the thickness of the protection film layer.

7. The etching characteristic estimation method according to claim 6, further comprising
a shape calculation step including, by the information processing apparatus, calculating a shape of the workpiece based on a result of calculating the crystal defect.

8. The etching characteristic estimation method according to claim 1, further comprising
a plasma state calculation step including, by the information processing apparatus, calculating a density of plasma used to etch the workpiece.

9. A program that causes a computer to execute:
a flux calculation step including, by an information processing apparatus, calculating a plurality of fluxes in a surface reaction model, a processed surface of a workpiece including a protection film layer and a reaction layer in the surface reaction model; and
a protection film layer calculation step including, by the information processing apparatus, calculating, a thickness of the protection film layer by using a calculation equation for calculating a thickness of an etched protection film layer based on a removal term for describing removal of the protection film layer, the removal term being selected depending on a comparison result of comparing the plurality of fluxes.

10. An information processing apparatus, comprising:
a flux calculation unit that calculates a plurality of fluxes in a surface reaction model, a processed surface of a workpiece including a protection film layer and a reaction layer in the surface reaction model; and
a protection film layer calculation unit that calculates a thickness of the protection film layer by using a calculation equation for calculating a thickness of an etched protection film layer based on a removal term for describing removal of the protection film layer, the removal term being selected depending on a comparison result of comparing the plurality of fluxes.

11. A designing method, comprising:
a flux calculation step including, by an information processing apparatus, calculating a plurality of fluxes in a surface reaction model, a processed surface of a workpiece including a protection film layer and a reaction layer in the surface reaction model;
a protection film layer calculation step including, by the information processing apparatus, calculating a thickness of the protection film layer by using a calculation equation for calculating a thickness of an etched protection film layer based on a removal term for describing removal of the protection film layer, the removal term being selected depending on a comparison result of comparing the plurality of fluxes;
a processing shape/crystal defect calculation step including, by the information processing apparatus, calculating a change in at least one of a processing shape and a crystal defect of the workpiece based on the thickness of the protection film layer; and
a designing step including, by the information processing apparatus, performing at least one of a processing process, an OPC (Optical Proximity Correction) design, and a layout design of a semiconductor device based on a calculation result obtained in the processing shape/crystal defect calculation step.

12. A processing apparatus, comprising:
a flux calculation unit that calculates a plurality of fluxes in a surface reaction model, a processed surface of a workpiece including a protection film layer and a reaction layer in the surface reaction model;
a protection film layer calculation unit that calculates a thickness of the protection film layer by using a calculation equation for calculating a thickness of an etched protection film layer based on a removal term for describing removal of the protection film layer, the removal term being selected depending on comparison result of comparing the plurality of fluxes;
a processing unit that performs processing of the workpiece in accordance with processing conditions of the workpiece;
a plasma state calculation unit that calculates a density of plasma used to etch the workpiece based on the processing conditions;
a processing shape/crystal defect calculation unit that calculates a change in at least one of a processing shape and a crystal defect of the workpiece based on a calculation result of the plasma state calculation unit and the thickness of the protection film layer; and
a control unit that changes the processing conditions based on a calculation result of the processing shape/crystal defect calculation unit.

13. A production method, comprising:
a flux calculation step including, by an information processing apparatus, calculating a plurality of fluxes in a surface reaction model, a processed surface of a workpiece including a protection film layer and a reaction layer in the surface reaction model;
a protection film layer calculation step including, by the information processing apparatus, calculating a thickness of the protection film layer by using a calculation equation for calculating a thickness of an etched protection film layer based on a removal term for describing removal of the protection film layer, the removal term being selected depending on a comparison result of comparing the plurality of fluxes;

a processing step including, by a processing unit, performing processing of the workpiece in accordance with processing conditions of the workpiece;
a plasma state calculation step including, by the information processing apparatus, calculating a density of plasma used to etch the workpiece based on the processing conditions;
a processing shape/crystal defect calculation step including, by the information processing apparatus, calculating a change in at least one of a processing shape and a crystal defect of the workpiece based on a calculation result of the plasma state calculation unit and the thickness of the protection film layer; and
a control step including, by a control unit, changing the processing conditions based on a calculation result of the processing shape/crystal defect calculation step.

\* \* \* \* \*